(12) United States Patent
Neftin et al.

(10) Patent No.: US 6,670,704 B1
(45) Date of Patent: Dec. 30, 2003

(54) DEVICE FOR ELECTRONIC PACKAGING, PIN JIG FIXTURE

(75) Inventors: Shimon Neftin, Kiryat Shmona (IL); Uri Mirsky, Nofit (IL)

(73) Assignee: Micro Components Ltd., Misgav (IL)

( * ) Notice: Subject to any disclaimer, the term of this patent is extended or adjusted under 35 U.S.C. 154(b) by 0 days.

(21) Appl. No.: 09/623,573

(22) PCT Filed: Nov. 25, 1999

(86) PCT No.: PCT/IL99/00633

§ 371 (c)(1),
(2), (4) Date: Feb. 9, 2001

(87) PCT Pub. No.: WO00/31797

PCT Pub. Date: Jun. 2, 2000

(30) Foreign Application Priority Data

Nov. 25, 1998 (IL) .................................... 127256

(51) Int. Cl.$^7$ ............................................. H01L 23/48
(52) U.S. Cl. ..................... 257/696; 257/734; 257/737; 257/738; 257/786; 257/773; 257/708; 258/706; 258/707; 258/773; 438/26; 438/106; 438/108; 438/118
(58) Field of Search ................................ 438/613, 612, 438/688, 635, 106, 108, 118, 26; 257/734, 737, 738, 685, 686, 698, 712, 773, 777, 778

(56) References Cited

U.S. PATENT DOCUMENTS

| | | |
|---|---|---|
| 4,045,302 A | 8/1977 | Gibbs et al. |
| 4,097,985 A | * 7/1978 | Morimoto et al. ......... 29/25.03 |
| 4,445,981 A | 5/1984 | Ishii et al. |
| 5,112,668 A | 5/1992 | Rabiet et al. |
| 5,229,549 A | 7/1993 | Yamakawa et al. |
| 5,580,825 A | 12/1996 | Labunov et al. |
| 5,774,336 A | 6/1998 | Larson |

(List continued on next page.)

FOREIGN PATENT DOCUMENTS

| | | |
|---|---|---|
| EP | 0 563 744 | 10/1993 |
| GB | 2 080 630 | 2/1982 |
| GB | 2 162 694 | 2/1986 |
| GB | 2 206 451 | 1/1989 |
| WO | 96 03771 | 2/1996 |

OTHER PUBLICATIONS

Patent Abstracts of Japan, Publication No. JP57126995, Publication Date Aug. 6, 1982, "Patterning Coloration of ALuminum or Aluminum Alloy", Satou et al.

Primary Examiner—Matthew Smith
Assistant Examiner—V. Yevsikov
(74) Attorney, Agent, or Firm—Browdy and Neimark, P.L.L.C.

(57) ABSTRACT

A device (1,21,28, 36, 37, 86, 103, 121, 128) for electronic packaging, the device including a discrete solid body having a pair of opposing generally parallel major surfaces, the solid body having a body portion of a porous valve metal oxide based material with a pair of exterior surfaces respectively constituting portions of the major surfaces and extending inward from one major surface towards the other major surface, the body portion having one or more electrically insulated valve metal conductive traces of from about 10 $\mu$m to about 400 $\mu$m thickness in a direction from one major surface to the other major surface embedded therein, one or more of said traces having a trace portion divergingly extending inward from an exterior surface constituting a portion of one of said major surfaces. A pin jig fixture (221, 232) for use with a electrical power source for porous anodization of a valve metal blank having a surface, the pin jig fixture comprising a bed of pins each having a leading end surface for intimate juxtaposition against the surface for masking a corresponding area thereof, one or more of said leading end surfaces being directly connected to the electrical power source for electrically connecting the electrical power source to the surface on intimate juxtaposition thereagainst.

32 Claims, 20 Drawing Sheets

U.S. PATENT DOCUMENTS

| | | |
|---|---|---|
| 5,946,600 A | 8/1999 | Hurwitz et al. |
| 5,952,083 A | 9/1999 | Parthasarathi et al. |
| 6,046,499 A | 4/2000 | Yano et al. |
| 6,072,233 A * | 6/2000 | Corisis et al. ............... 257/686 |
| 6,235,181 B1 | 5/2001 | Kinard et al. |
| 6,236,112 B1 | 5/2001 | Horiuchi et al. |
| 6,262,477 B1 | 7/2001 | Mahulikar et al. |

* cited by examiner

DEVICE FOR ELECTRONIC PACKAGING, PIN JIG FIXTURE

CROSS REFERENCE TO RELATED APPLICATION

The present application is the national stage under 35 U.S.C. 371 of PCT/IL99/00633, filed Nov. 25, 1999.

FIELD OF THE INVENTION

This invention relates to electronic packaging and assembly devices, including inter alia ball grid array packaging (BGA), chip size/scale packaging (CSP) and multi-chip-module/packaging (MCP/MCM), passive electrical devices, and a process of manufacturing therefor. In addition, the invention relates to a fixture for masking purposes.

BACKGROUND OF THE INVENTION

Microelectronic devices are typically manufactured from a brittle semiconductor material which requires protection from moisture and mechanical damage as provided for: by an electronic package which also contains electrically conductive traces to connect between a semiconductor device and external circuitry.

Depending on the intended complexity of an electronic package, a multi-layer interconnect structure can be interposed between one or more integrated circuit chips (ICCs) and a substrate (PCB). One such multi-layer interconnection structure is illustrated and described in U.S. Pat. No. 5,661,341 to Neftin and includes aluminum layers, each layer typically having a thickness of several micrometers and being deposited on a previously prepared topside of an underlying layer.

Another package design which minimizes space requirements and provides a high density of interconnections between circuit chips and external circuitry is a Ball Grid Array (BGA) packages Different types of BGA packages have been described in that art and include a metal based BGA package as illustrated and described in WO 94/22168 to Mahulikar and a plastic based BGA package as illustrated and described in U.S. Pat. No. 5,355,283 to Marrs R. C. et al. U.S. Pat. No. 5,045,921 to Lin P. T. et al. In the former type, a metallic base contains a plurality of electrical conductive vias which are electrically isolated from the base have opposite ends respectively electrically connected to external circuitry and an integrated circuit device. The process for manufacturing such a BGA package includes drilling holes in the metal base, anodizing the metal base and inserting metal pins into the insulated holes. Such a metal based BGA package has good thermal performance. In the latter type, an organic material is used to form dielectric layers of a multi-layered substrate having vias formed by mechanical or laser drilling and into which are inserted electrically conductive material. This BGA type package has low thermal performance and facilitates a relatively high interconnection density capability.

BGA packages have now been developed with improved heat dissipation from the heat producing dies. Particular implementations are illustrated and described inter alia in U.S. Pat. Nos. 5,583,778 and 5,629,835.

Conventional masking for area selective anodization purposes is a relatively complicated and expensive process including the application and subsequent removal of an inert masking layer using photolithography and deposition techniques. A masking layer can be in the form of photoresist material, a dense oxide layer, a tantalum metal thin film, and the like. In U.S. Pat. No. 5,661,341, there is described the use of a photoresist mask. In WO 95/08841, there is described the use a dense oxide mask. In JP 1,180,998, there is described the use of rubber mask. In JP 54,0332,279, there is described the use of a metal mask. In JP 59,094,438, there is described the use of a photoresist mask in an anodization process.

SUMMARY OF THE INVENTION

In accordance with a first aspect of the present invention, there is provided a device comprising a discrete solid body having a pair of opposing generally parallel major surfaces, said solid body having a body portion of a porous valve metal oxide based material with a pair of exterior surfaces respectively constituting portions of said major surfaces and extending inward from one said major surface towards the other said major surface, said body portion having one or more electrically insulated valve metal conductive traces of from about 10 $\mu$m to about 400 $\mu$m thickness in a direction from one said major surface to the other major surface embedded therein, one or more of said traces having a trace portion divergingly extending inward from an exterior surface constituting a portion of one of said major surfaces.

Porous anodization penetrates an original valve metal blank at a slightly higher rate in the direction of a voltage difference across its opposing major surfaces than in a transverse direction thereto such that a circular masking element on one of a valve metal blank's major surfaces effectively protects an inwardly directed diverging cone shaped valve metal via during a so-called one-sided porous anodization of the blank. In a similar manner, a pair of circular masking elements applied to both of a blank's major surfaces in registration to one another such that their centers are concentric effectively protect a barrel shaped valve metal via during a so-called two-sided porous anodization. One-sided porous anodization can typically anodize a valve metal blank to a maximum porous oxide thickness of about 200 $\mu$m relative to one of its opposing major surfaces whilst two-sided porous anodization can typically anodize a valve metal blank to a maximum porous oxide thickness of about 400 $\mu$m thereby delimiting the thickness of an electrically insulated valve metal conductive trace from about 10 $\mu$m to about 400 $\mu$m thickness.

A device of the present invention can be fabricated from suitable valve metal blanks of aluminum, titanium, tantalum, and other valve metals and preferably include inter alia Al 5052, Al 5083, Al 5086, Al 1100, Al 1145, and the like. A device of the present invention can be readily manufactured to customer requirements in terms of a desired product specification including inter alia electrical properties; thermo-mechanical properties such as thermal coefficient of expansion (TCE), Young modulus, elasticity; thermal properties such as thermal conductivity coefficient; and other factors. A device of the present invention has good thermal performance, facilitates high interconnection density capability and can. be manufactured by a low cost, simple, environmental friendly process.

Each device can be considered as being constituted by different combinations of evo or more types of basic building blocks extending between a device's opposing major surfaces. The building blocks include a full original valve metal building block, a full porous oxide building block, a composite porous oxide on original valve metal building block, a composite original valve metal on porous oxide building block and a sandwich porous oxide on original valve metal on porous oxide building block. A wide range of devices of the present invention are envisaged including inter alia a Ball Grid Array (BGA) support structure, a Multi-Chip Module (MCM) support structure, a Chip Scale Package (CSP) support structure for connecting IC devices or devices and electronic boards typically printed circuit boards (PCBs), an interconnect device for interconnection purposes, a coil for coil and transformer applications, and others.

In accordance with a second aspect of the present invention, there is provided a process for manufacturing a device having a desired product specification, the process comprising the steps of:

(a) providing a discrete valve metal blank having a pair of opposing generally parallel major surfaces;

(b) selectively masking at least one of the major surfaces of the blank in accordance with the desired product specification; and (c) porously anodizing the selectively masked blank for converting a body portion thereof into porous valve metal oxide and having a pair of exterior surfaces respectively constituting portions of the major surfaces and extending inward from one major surface to the other major surface, the body portion having one or more electrically insulated valve metal conductive traces of from about 10 μm to about 400 μm thickness in a direction from one major surface to the other major surface embedded therein, one or more of the traces having a trace portion divergingly extending inward from an exterior surface constituting a portion of one of the major surfaces.

The process of the present invention can manufacture a device with a relatively simple product specification with a single porous oxide thicknesses with respect to either one of the blank's opposing major surfaces from a valve metal blank by a single one-sided porous anodization or both of the blank's opposing major surfaces by a single dual-sided porous anodization. In addition, the process of the present invention can manufacture a device with a relatively complicated product specification with two or more different porous oxide thicknesses in respect of one or both of the blank's opposing major surfaces. Such different porous oxide thicknesses can be achieved either by two or more consecutive porous anodizations each with different masking or, alternatively, by a single porous anodization with masking applied to the blank's opposing major surfaces for protecting different areas thereof against porous anodization for different lengths of time.

Different time delay protection can be achieved by dense oxide masking elements (hereinafter referred to as DOMEs) of different thicknesses which are themselves converted to porous oxide during porous anodization. However, conversion of dense oxide occurs at a far slower rate than the conversion of original valve metal material such that, for example, a 0.1 μm thick DOM protects underlying original valve metal material for about 3 hours during which time one-sided porous anodization can normally convert original valve metal material to porous oxide to thickness of 40 μm. The process of the present invention can also employ a composite mask including a photoresist mask on a relatively thick DOM, for example, 0.5 μm, so as to effectively block porous anodization of original valve metal material under the DOM.

The process of manufacturing devices in accordance with the present invention is suitable for large area panel production containing a plurality of devices.

During or post porous anodization, suitable substances can be impregnated into a blank's porous oxide portions in order to seal its pores, for example, as described in U.S. Pat. No. 3,622,473 to Toshiyuki et. al. In addition, a blank typically thickens during porous anodization such that it requires planarization to a desired degree of planarity and to arrive at a desired thickness for the BGA, MCM, CSP support structures, and the like.

In accordance with a third aspect of the present invention, there is provided a pin jig fixture for use with an electrical power source for porous anodization of a valve metal blank having a surface, the pin jig fixture comprising a bed of pins each having a leading end surface for intimate juxtaposition against the surface for masking a corresponding area thereof, one or more of said leading end surfaces being directly connected to the electrical power source for electrically connecting the electrical power source to the surface on intimate juxtaposition thereagainst.

A pin jig fixture in accordance with the present invention enables the simultaneous masking of one or more areas of a surface of a valve metal blank by its mechanical clamping thereagainst and the electrical connection to an electrical power source for porous anodization of the blank. Thus, the pin jig fixture advantageously negates the need for an otherwise redundant portion of a valve metal blank which is conventionally initially used for connection to an electrical power source and which is subsequently removed.

BRIEF DESCRIPTION OF THE DRAWINGS

In order to understand the invention and to see how it may be carried out in practice, preferred embodiments will now be described, by way of non-limiting examples only, with reference to the accompanying drawings, in which similar parts are likewise numbered and in which:

FIGS. 18A–18J are cross sectional views of a portion of an aluminum blank illustrating the process for manufacturing of the device of FIG. 13;

DETAILED DESCRIPTION OF THE DRAWINGS

Figure 1:
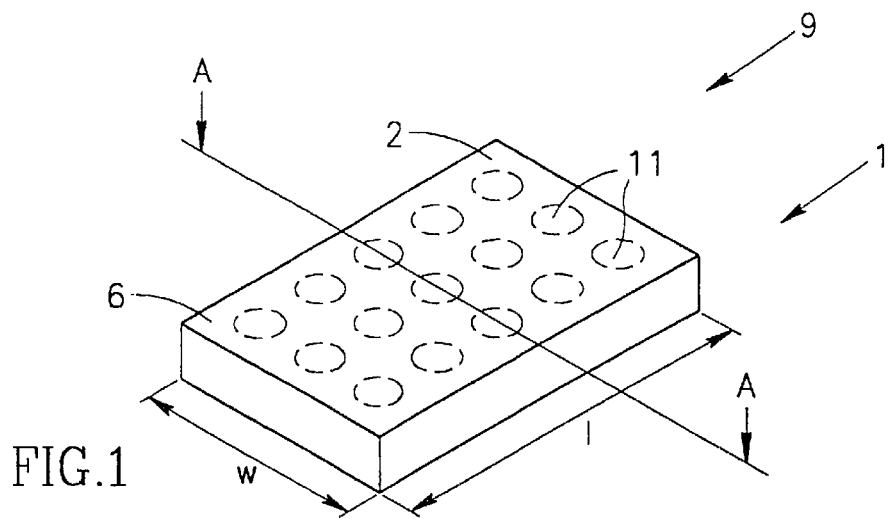
FIG. 1 is a pictorial view of a device in accordance with a first embodiment of the present invention.

In the drawings, different materials during the process of manufacturing a device of the present invention are shown in different shading, the different materials including aluminum metal, porous aluminum oxide, dense aluminum oxide, and a mask. In addition, porous anodization is illustrated by arrows with curly tails whilst dense anodization is illustrated by arrows with straight tails. For the sake of clarity, the thicknesses of DOMEs which are typically in the range of about 0.1–0.5 $\mu$m are not drawn to scale relative to an aluminum blank which has an approximate 200 $\mu$m thickness.

Figure 2:
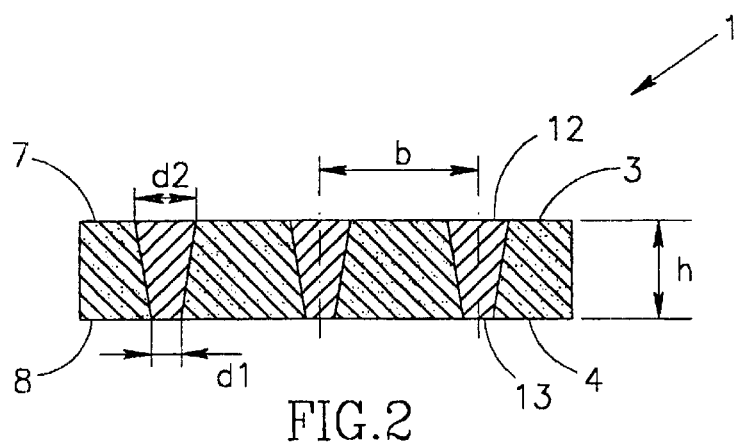
FIG. 2 is a cross sectional view of the device of FIG. 1 along line A—A in FIG. 1.
Figure 3:
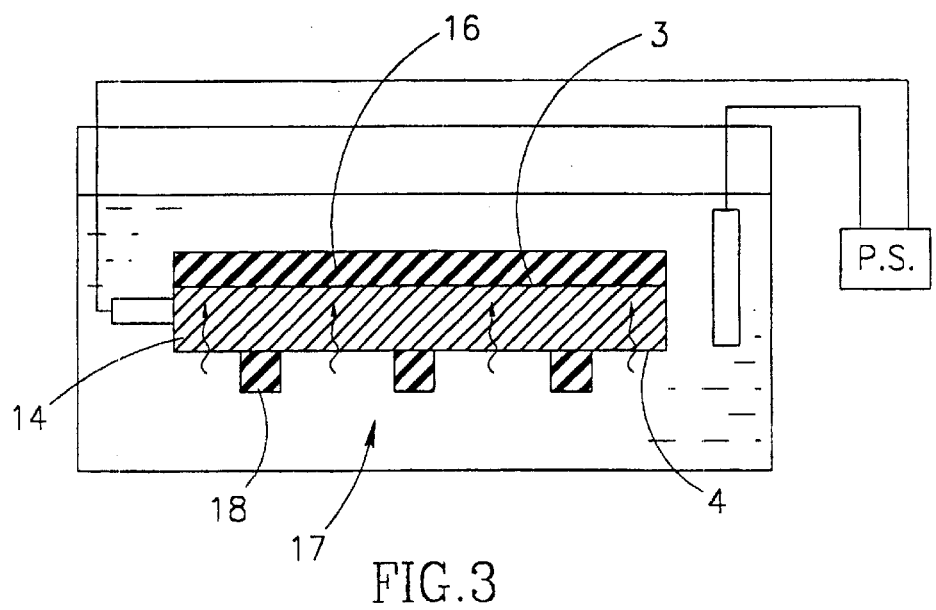
FIG. 3 is a pictorial view showing a single one-sided porous anodization process for the manufacture of the device of FIG. 1.

With reference now to FIGS. 1–3, a device 1 for use as a BGA support structure, a MCM support structure, a CSP support structure and the like has a discrete solid body 2 with opposing generally parallel major surfaces 3 and 4. The solid body 2 has a sealed or unsealed porous aluminum oxide body portion 6 with a pair of exterior surfaces 7 and 8 constituting portions of the major surfaces 3 and 4, respectively. The body portion 6 has an array of one or more electrically insulated inverted frusto-conical aluminum vias 9 embedded therein. Each aluminum via 11 constitutes an electrically insulated original valve metal conductive trace and has exterior surfaces 12 and 13 constituting portions of the major surfaces 3 and 4, respectively. The device 1 is manufactured from an aluminum blank 14 with a full mask 16 applied to its major surface 3 and an array 17 of circular masking elements 18 corresponding to the array of aluminum vias 9 applied to its major surface 4 prior to its undergoing one stage one-sided porous anodization. A typical device 1 has the follow specification: l=0.2 cm, w=0.1 cm, h=100 $\mu$m, b=300 $\mu$m, $d_1$=35 $\mu$m, and $d_2$=75 $\mu$m.

Figure 4:
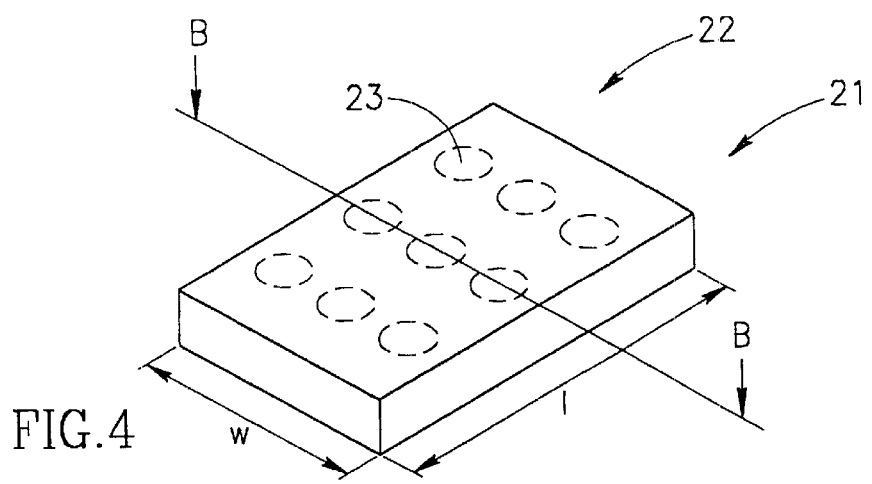
FIGS. 4–6 correspond to FIGS. 1–3 for a device in accordance with a second embodiment of the present invention manufactured during a single dual-sided porous anodization process.
Figure 5:
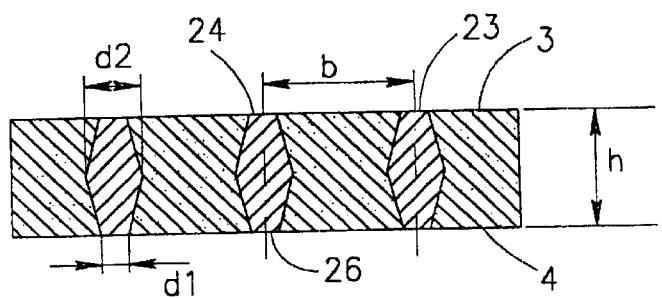
Figure 6:
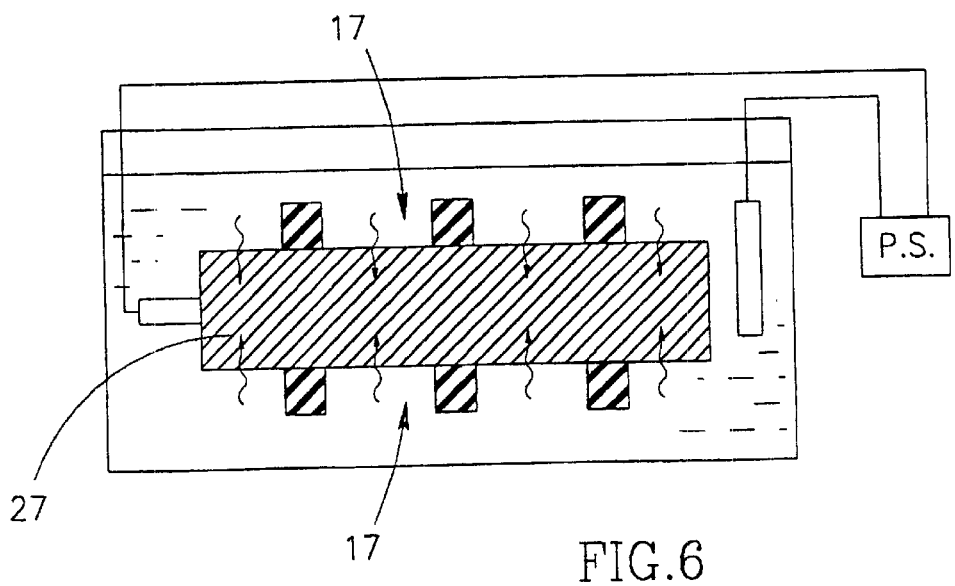

Turning now to FIGS. 4–6, a device 21 is similar to the device 1 of FIG. 1 and differs therefrom in that it is thicker and has an array of one or more barrel shaped aluminum vias 22, namely, each aluminum via 23 initially diverges and thereafter converges from an exterior surface 24 constituting a portion of the major surface 3 to an exterior surface 26 constituting a portion of the major surface 4. The device 21 is manufactured from an aluminum blank 27 with two identical arrays 17 applied to its major surfaces 3 and 4 prior to its undergoing one stage dual-sided porous anodization. A typical device 21 has the following specification: l=0.2 cm, w=0.1 cm, h=200 $\mu$m, b=0.3 mm, $d_1$=35 $\mu$m, and $d_2$=75 $\mu$m.

Figure 7:
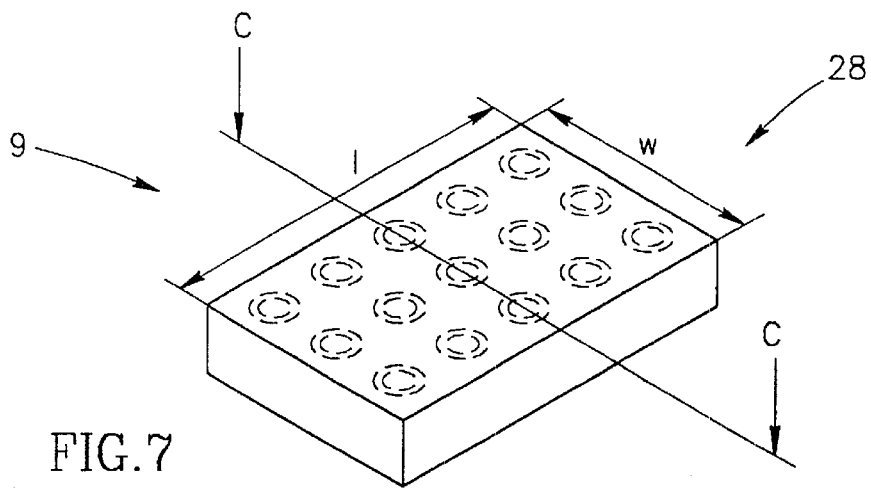
FIGS. 7–9 correspond to FIGS. 1–3 for a device in accordance with a third embodiment of the present invention manufactured during a single one-sided porous anodization process.
Figure 8:
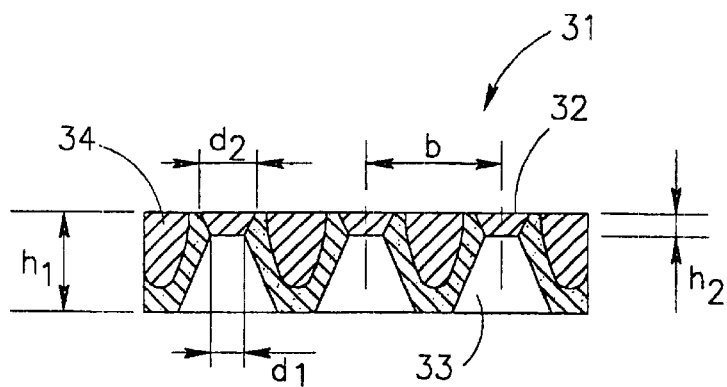
Figure 9:
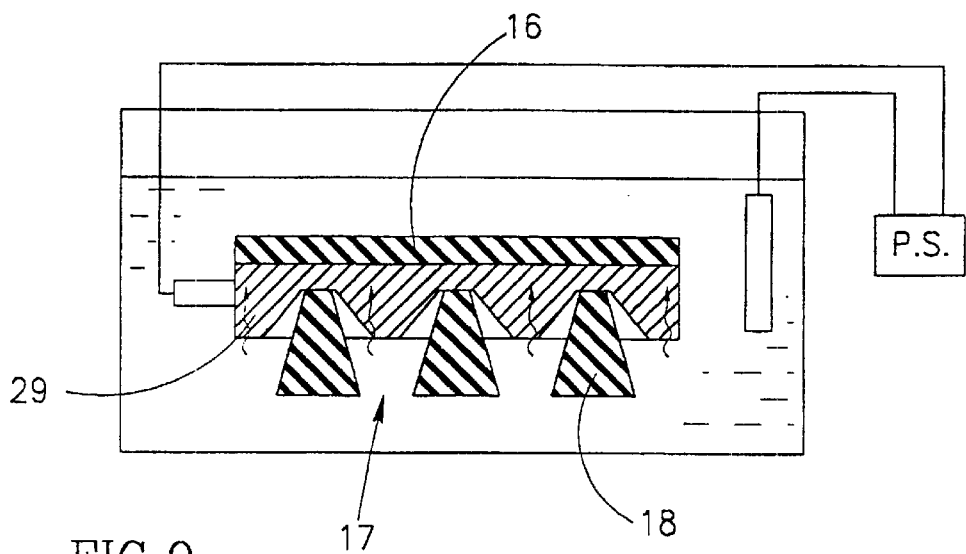

Turning now to FIGS. 7–9, a device 28 is similar to the device 1 of FIG. 1 and differs therefrom in that it manufactured from an aluminum blank 29 having an array of thin regions 31, each thin region 32 being atop a frusto-conical shaped recess 33. The aluminum blank 29 undergoes one stage one-sided porous anodization in a similar fashion to the aluminum blank 14 of FIG. 3 so as to form an array of aluminum vias 9 in the thin regions 32 and whereby electrically insulated aluminum pockets 34 are also formed. A typical device 28 has the following specification: l=0.6 cm, w=0.4 cm, $h_1$=500 $\mu$m, $h_2$=100 $\mu$m, b=1000 $\mu$m, $d_1$=100 $\mu$m, and $d_2$=150 $\mu$m.

Figure 10:
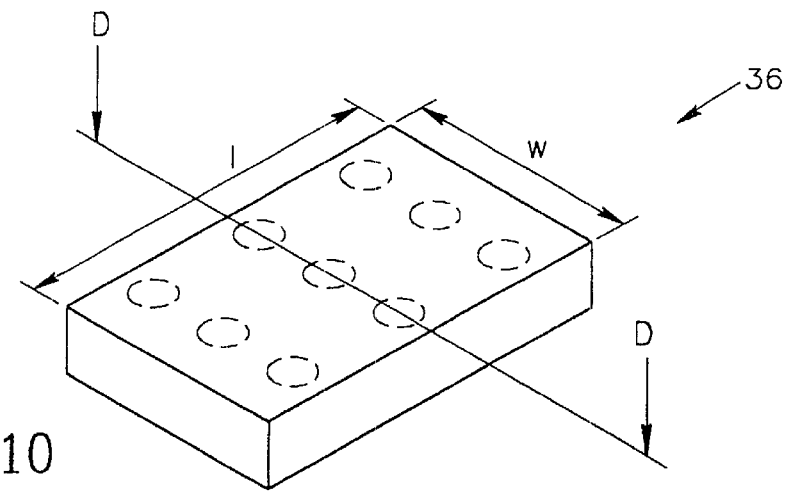
FIGS. 10–12 correspond to FIGS. 1–3 for a device in accordance with a fourth embodiment of the present invention manufactured during a single dual-sided porous anodization process.
Figure 11:
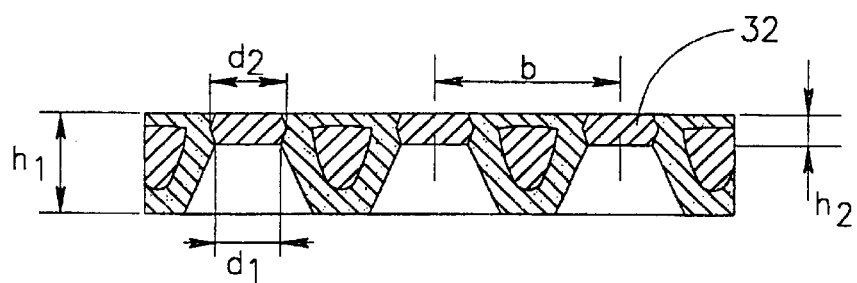
Figure 12:
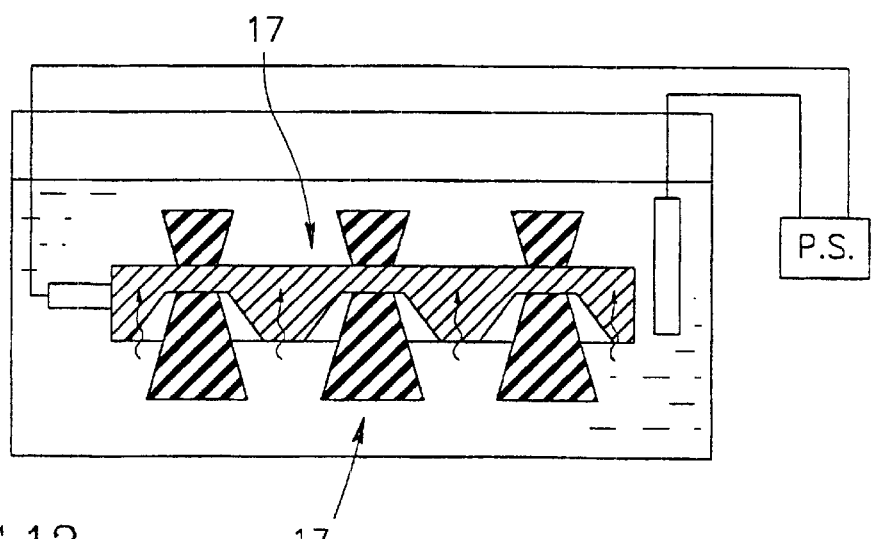

Turning now to FIGS. 10–12, a device 36 is similar to the device 28 of FIG. 7 and differs therefrom in that it has thicker thin portions 32 thereby requiring one stage dual-sided porous anodization in a similar fashion to the blank 27 of FIG. 6 which leads to an array of barrel-shaped aluminum vias 22. A typical device 36 has the following specification: l=0.4 cm, w=0.4 cm, $h_1$=500 $\mu$m, $h_2$=200 $\mu$m, b=1000 $\mu$m, $d_1$=150 $\mu$m, and $d_2$=200 $\mu$m.

Figure 13:
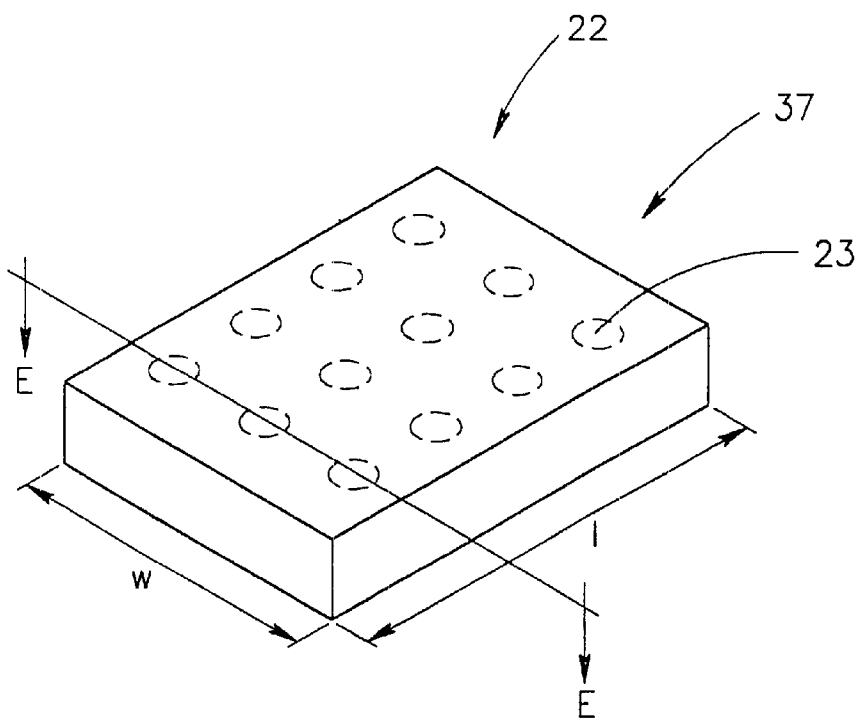
FIG. 13 is a pictorial view of a device in accordance with a fifth embodiment of the present invention.
Figure 14:
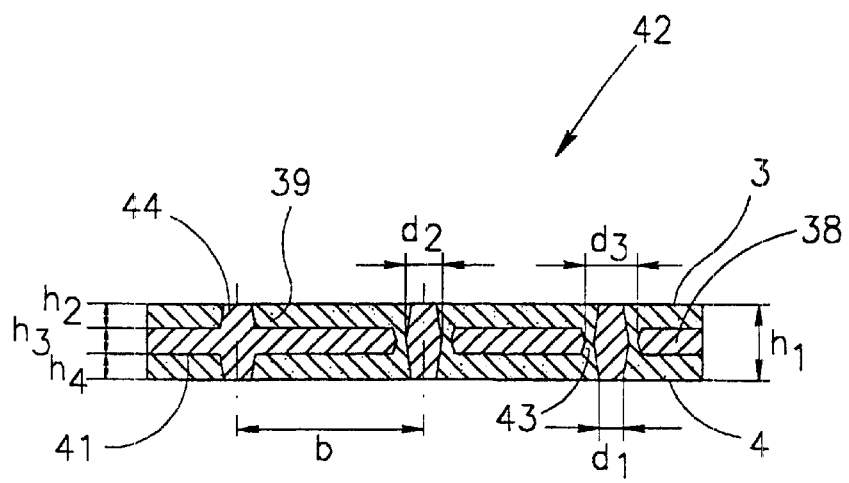
FIG. 14 is a cross sectional view of the device of FIG. 13 along line E—E in FIG. 13.

Turning now to FIGS. 13 and 14, a device 37 is similar to the device 21 of FIG. 4 in that it includes an array of barrel shaped aluminum vias 22 and differs therefrom in that it further includes an earthed aluminum slab 38 also constituting an electrically insulated original valve metal conductive trace. The slab 38 has major surfaces 39 and 41 respectively parallel to the major surfaces 3 and 4 and an array of aluminum oxide insulating generally tubular portions 42 each tubular portion 43 outwardly extending to the major surfaces 3 and 4 and having an aluminum via 23 transversing therethrough. The slab 38 is earthed by means of an earth connection aluminum via 44. A typical device 37 has the following specification: l=0.5 cm, w=0.4 cm, $h_1$=200 $\mu$m, $h_2$=$h_4$=90 $\mu$m, $h_3$=20 $\mu$m, b=1 mm, $d_1$=150 $\mu$m, $d_2$=300 $\mu$m, $d_3$=600 $\mu$m.

The device 37 can be manufactured from an aluminum blank 46 with opposing major surfaces 47 and 48 by either a consecutive two stage dual-sided porous anodization process described hereinbelow with reference to FIGS. 16A–16F using masks described hereinbelow with reference to FIGS. 15A and 15B or, alternatively, a one stage dual-sided porous anodization process described hereinbelow with reference to FIGS. 18A–18J using masks described hereinbelow with reference to FIGS. 17A–17C.

Figure 15A:
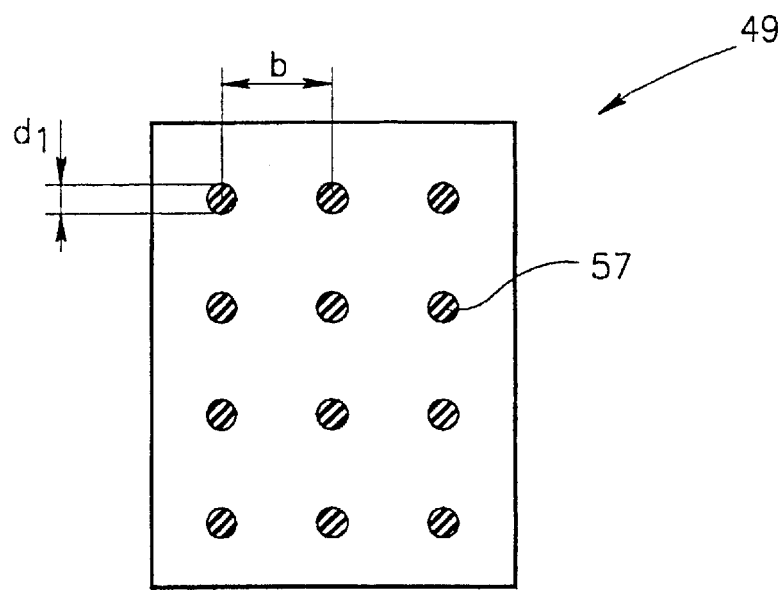
FIGS. 15A and 15B are top views of two masks for the manufacture of the device of FIG. 13 during a consecutive two stage dual-sided porous anodization process.
Figure 15B:
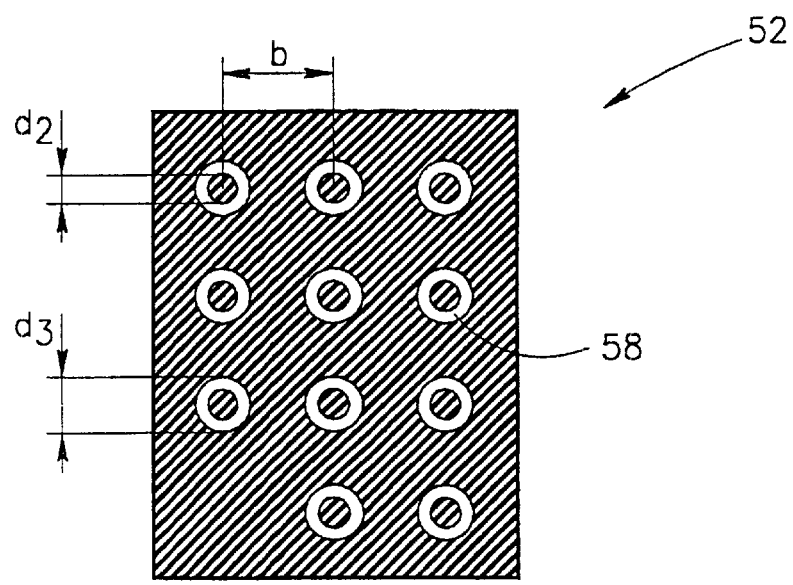

Turning noes to FIGS. 15A and 15B, FIG. 15A shows a mask 49 for selectively masking each of the aluminum blank's major surfaces 47 and 48 during a first dual-sided porous anodization step to arrive at an intermediate product 51 (see FIG. 16C) whilst FIG. 15B shows a mask 52 for selectively masking each of the intermediate product's major surfaces 53 and 54 during a second dual-sided porous anodization step for manufacturing a precursor 56 (see FIG. 16F) of the device 37. The mask 49 includes an array of circular masking elements 57 whilst the mask 52 includes an array of annular apertures 58. The mask 52 is missing an annular aperture in the bottom left hand corner for the forming of the aluminum via 44. The dimensions of the masking elements 57 and the apertures 58 are as follows: $d_1=d_2=300$ μm, $d_3=600$ μm, and b=1000 μm.

Figure 16A:
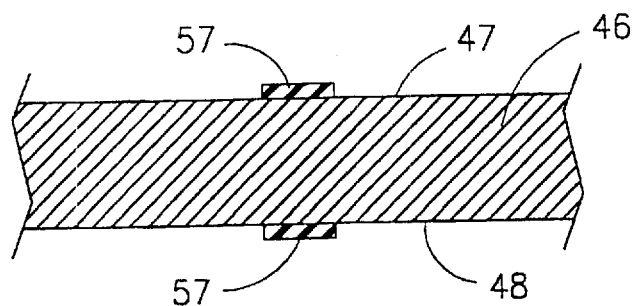
FIGS. 16A–16F are cross sectional views of a portion of an aluminum illustrating the process for manufacturing the device of FIG. 13.
Figure 16B:
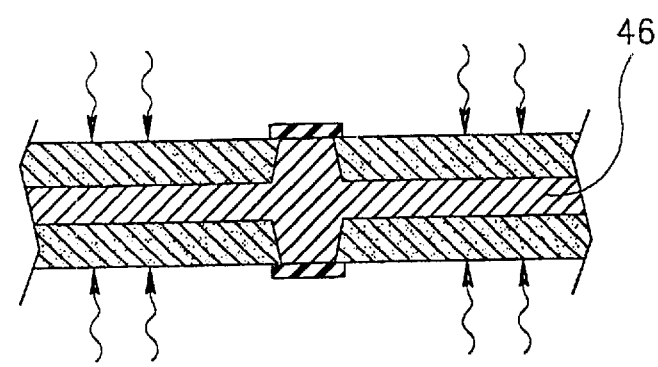
Figure 16C:
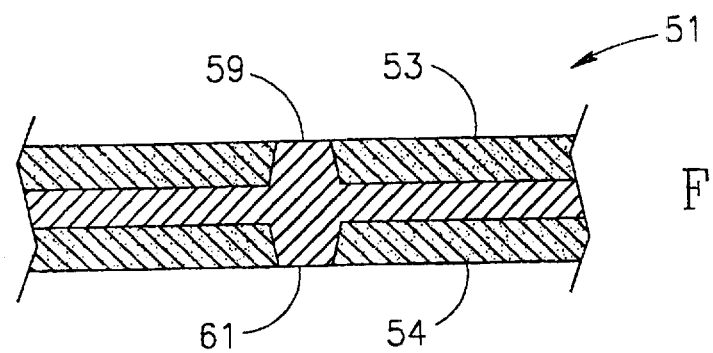
Figure 16D:
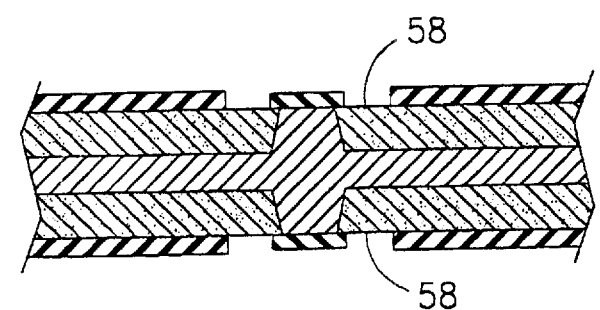
Figure 16E:
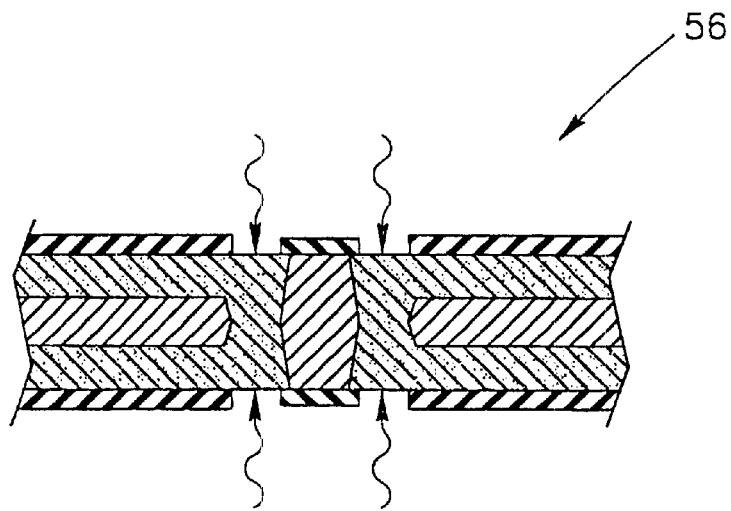
Figure 16F:
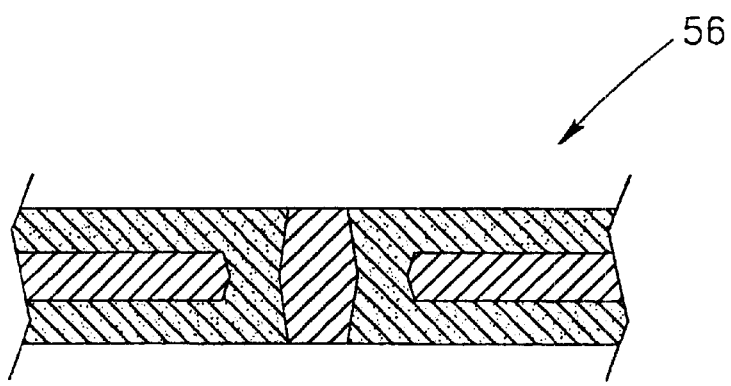

Turning now to FIGS. 16A–16F, a pair of masks 49 are applied to the aluminum blank's major surfaces 47 and 48 in registration to one another such that centers of opposite masking elements 57 are concentric (see FIG. 16A). The masked aluminum blank 46 undergoes a short first dual-sided porous anodization to form the intermediate product 51 (see FIG. 16B). The masks 49 are removed from the intermediate product 51 whereupon its major surfaces 53 and 54 each have a pattern of aluminum exterior surfaces 59 and 61 corresponding to the masking elements 57 (see FIG. 16C). A pair of masks 52 are applied to the intermediate product's major surfaces 53 and 54 in registration to the pattern of aluminum exterior surfaces 59 and 61 such that the center of each annular aperture 58 coincides with the center of an aluminum exterior surface 59 and 61 (see FIG. 16D). The intermediate product 51 undergoes a second dual-sided porous anodization to form the precursor 56 (see FIG. 16E) which is finished by lapping and polishing (see FIG. 16F).

Figure 17A:
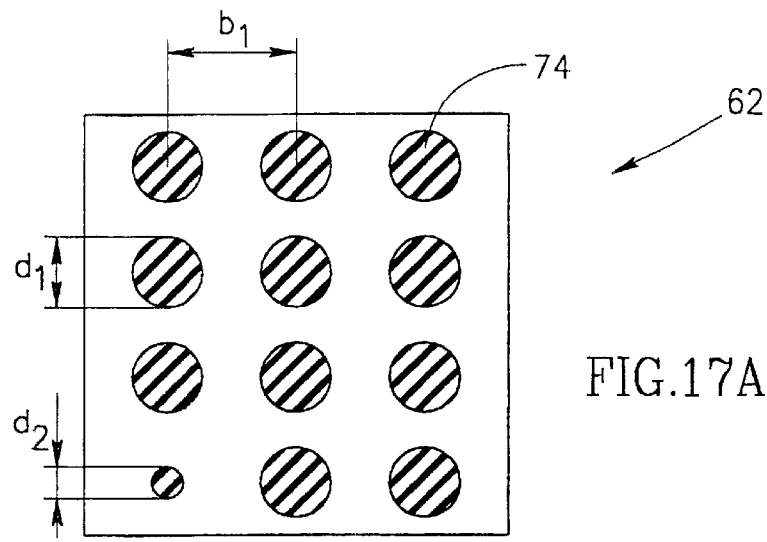
FIGS. 17A–17C are top views of three masks for the manufacture of the device of FIG. 13 during a one stage dual-sided porous anodization process with delayed masks.
Figure 17B:
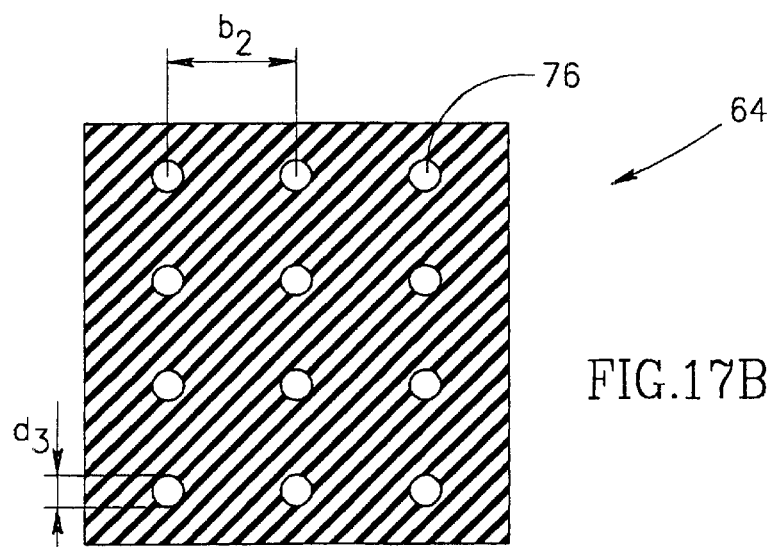
Figure 17C:
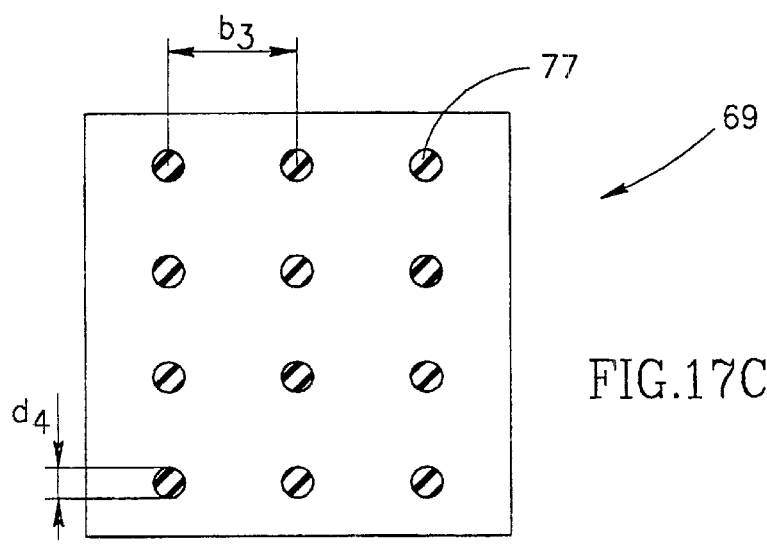

Turning now to FIGS. 17A to 17C, FIG. 17A shows a mask 62 for selectively masking the aluminum blank's major surfaces 47 and 48 during a low voltage dense anodization step to arrive at a first intermediate product 63 (see FIG. 18C) whilst FIG. 17B shows a mask 64 for selectively masking the first intermediate product's major surfaces 66 and 67 during a high voltage dense anodization step to arrive at a second intermediate product 68 (see FIG. 18F) whilst FIG. 17C shows a mask 69 for selectively masking the second intermediate product's major surfaces 71 and 72 during a porous anodization step to arrive at a precursor 73 (see FIG. 18J) of the device 37.

The mask 62 includes an array of circular masking elements 74, the mask 64 includes an array of circular apertures 76 and the mask 69 includes an array of circular masking elements 77. The mask 62 includes a smaller circular masking element in the bottom left hand corner for the forming of the aluminum via 44. The dimensions of the masking elements 74 and 77 and apertures 76 are as follows: $d_1=600$ μm, $d_2=d_3=d_4=300$ μm and $b_1=b_2=b_3=1000$ μm.

Figure 18A:
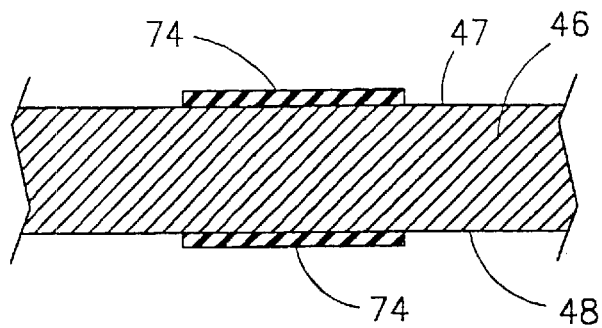
Figure 18B:
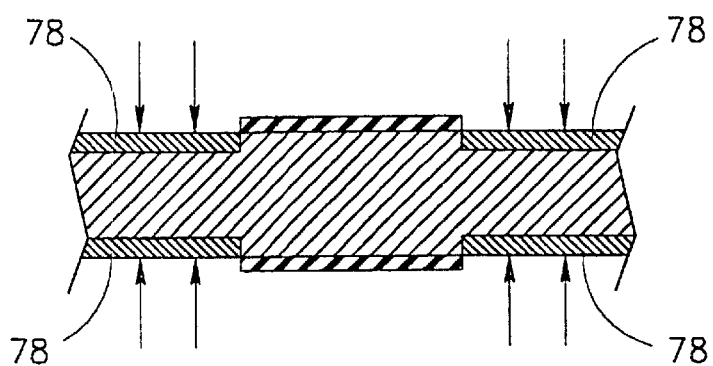
Figure 18C:
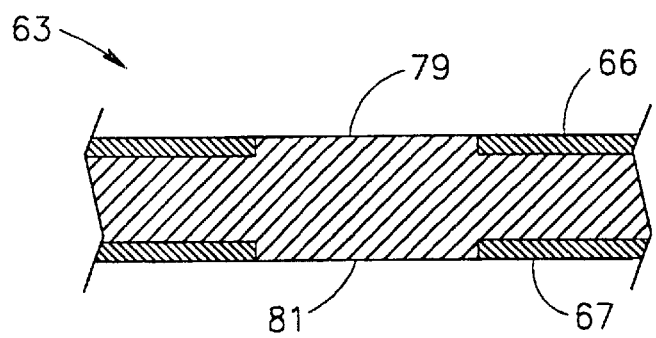
Figure 18D:
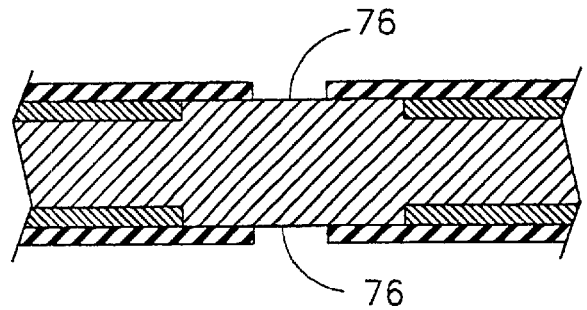
Figure 18E:
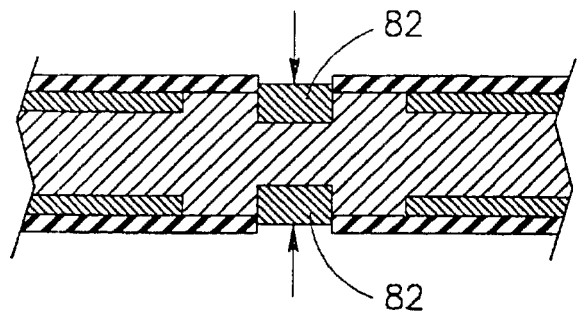
Figure 18F:
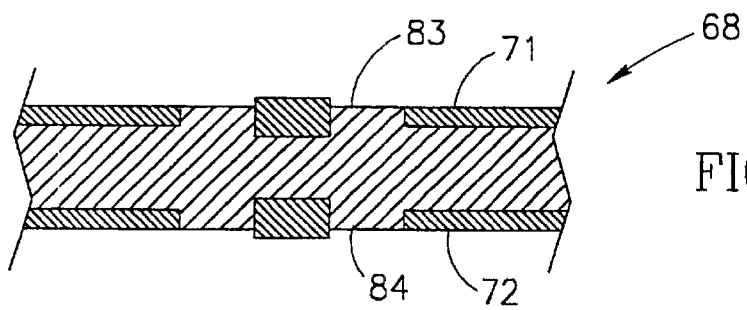
Figure 18G:
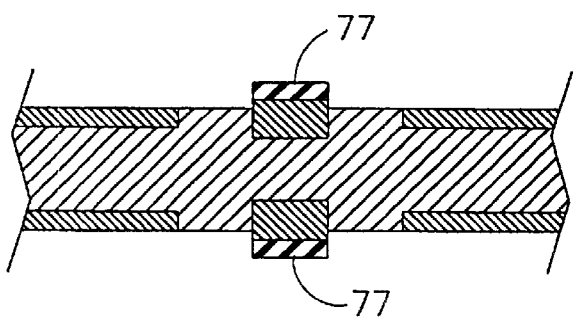
Figure 18H:
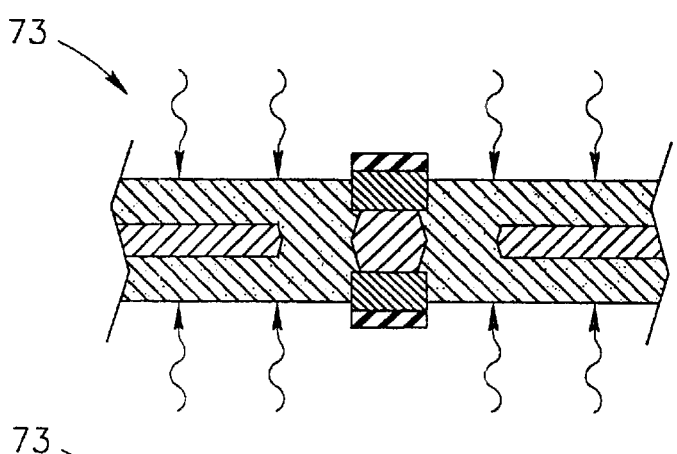
Figure 18J:
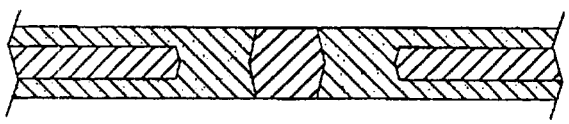

Turning now to FIGS. 18A to 18J, a pair of masks 62 are applied to the aluminum blank's major surfaces 47 and 48 in registration to one another such that centers of opposite masking elements 67 are concentric (see FIG. 18A). The masked aluminum blank 46 undergoes a low voltage dual-sided dense anodization to form the intermediate product 63 with thin DOMEs 78 (see FIG. 18B). The masks 62 are removed from the intermediate product 63 whereupon its major surfaces 66 and 67 each have a pattern of aluminum exterior surfaces 79 and 81 corresponding to the masking elements 74 (see FIG. 18C). A pair of masks 64 are applied to the intermediate product's major surfaces 66 and 67 in registration to one another such that the center of each aperture 76 coincides with the center of an aluminum exterior surface 79 and 81 (see FIG. 18D). The intermediate product 63 undergoes a high voltage dual-sided dense anodization to form the intermediate product 68 with thick DOMEs 82 (see FIG. 18E). The masks 64 are removed from the intermediate product 68 whereupon its major surfaces 71 and 72 each have a pattern of aluminum exterior surfaces 83 and 84 (see FIG. 18F). A pair of masks 69 are applied to intermediate product's major surfaces 71 and 72 in registration with one another such that the centers of the masking elements 77 coincide with the centers of the thick DOMs 82 (see FIG. 18G). The intermediate product 68 undergoes dual-sided porous anodization to form the precursor 73 (see FIG. 18H) which is finished by lapping and polishing to remove the thick DOMs 82 (see FIG. 18J).

Figure 19A:
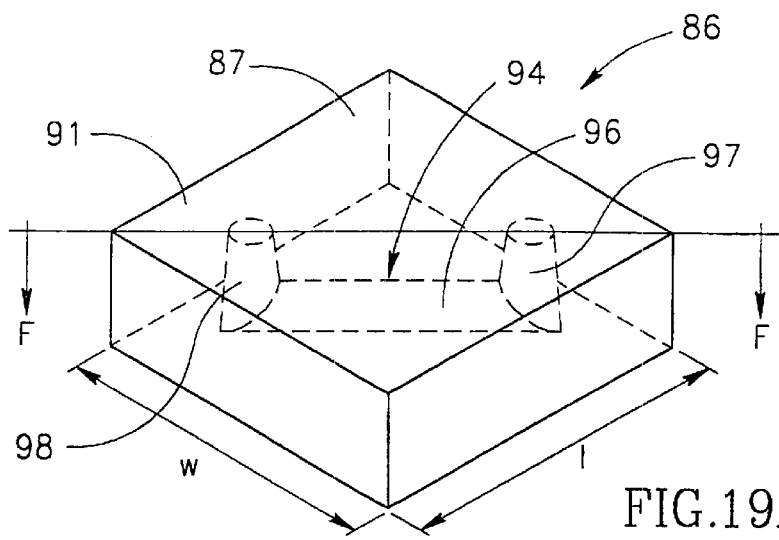
FIGS. 19 and 20 correspond to FIGS. 13 and 14 for a device in accordance with a sixth embodiment of the present invention.
FIG. 19B is a pictorial view of a modification of the device of FIG. 19A.
Figure 19B:
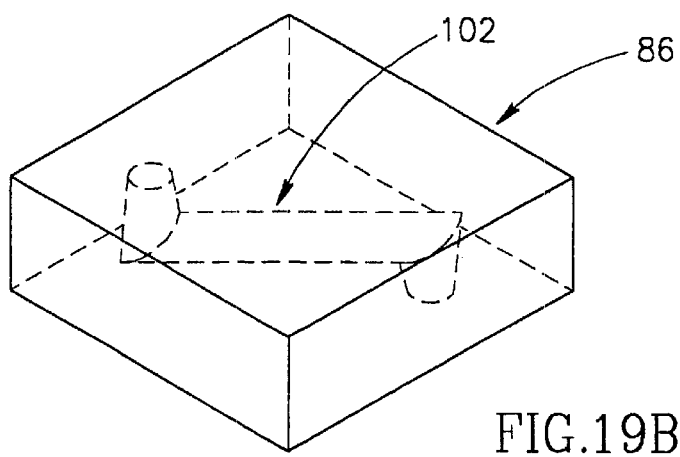
Figure 20:
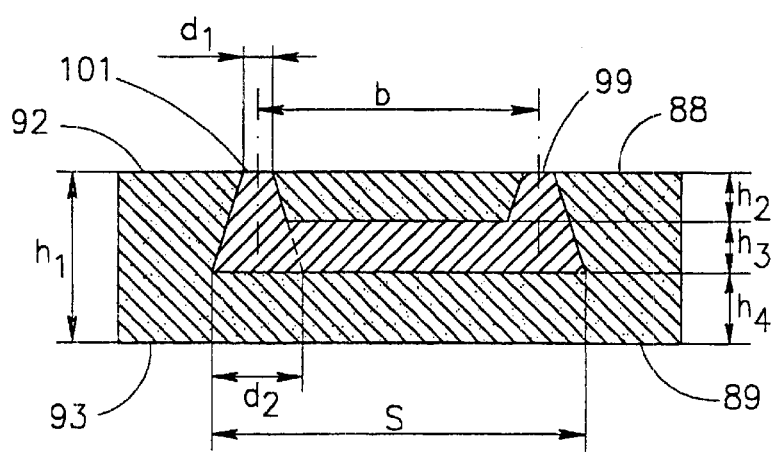

Turning now to FIGS. 19 and 20, a device 86 for use as an interconnection unit for connecting different electronic elements includes a discrete solid body 87 with opposing generally parallel major surfaces 88 and 89. The solid body 87 has a sealed porous aluminum oxide body portion 91 with a pair of exterior surfaces 92 and 93 constituting a portion of the major surfaces 88 and 89, respectively. The body portion 91 has an electrically insulated U-shaped aluminum trace 94 embedded therein. The trace 94 includes a major horizontal generally rod-shaped trace portion 96 and two minor vertical trace portions 97 and 98 with exterior surfaces 99 and 101, respectively, constituting a portion of the major surface 88. A typical device 86 has the following specification: 1=3 cm, w=3 cm, $h_1=50$ μm, $h_2=h_3=5$ μm, $h_4=40$ μm, b=20 mm, $d_1=35$ μm, $d_2=40$ μm, s=20.01 mm. Alternatively, the device 86 can have a trace 102 with oppositely directed minor vertical trace portions (see FIG. 19B).

Figure 21:
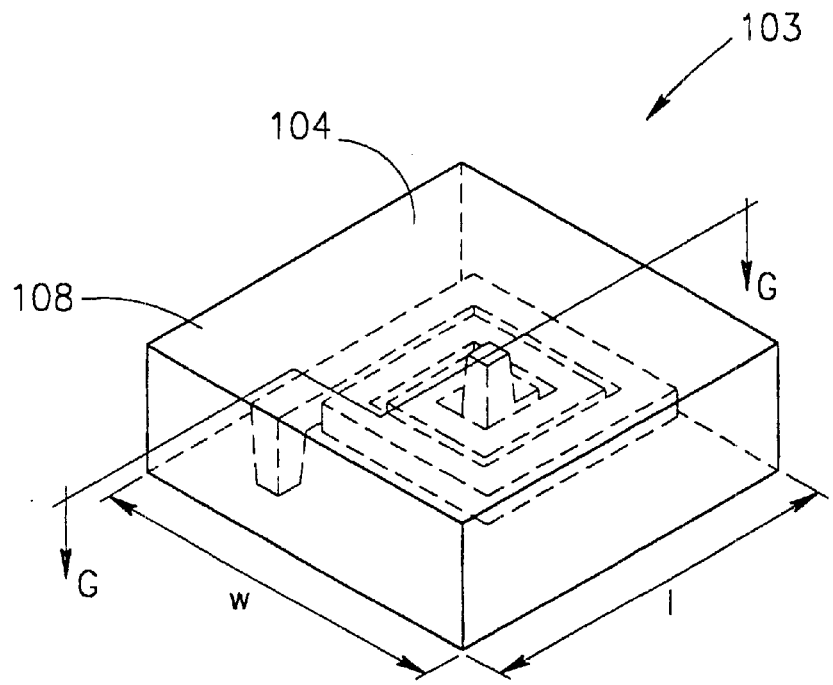
FIGS. 21 and 22 correspond to FIGS. 13 and 14 for a device in accordance with a seventh embodiment of the present invention.
Figure 22:
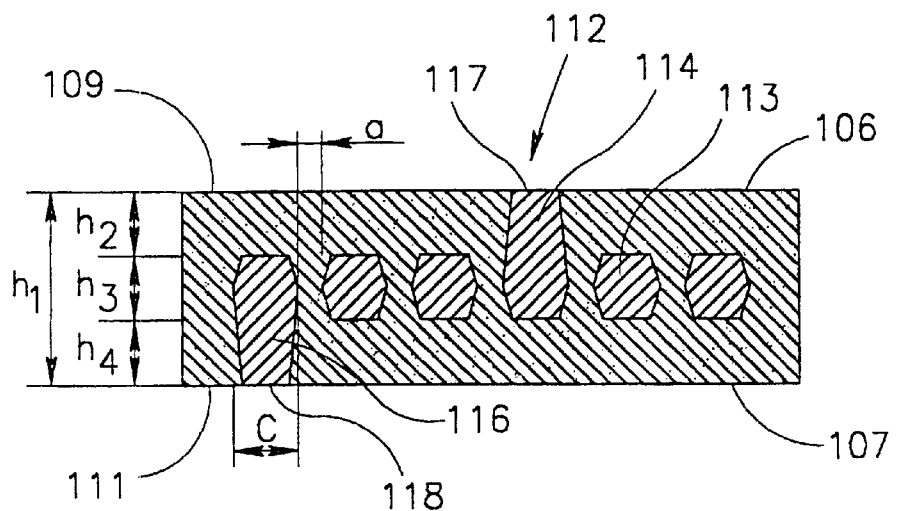

Turning now to FIGS. 21 and 22, a device 103 for use as a coil for coil and transformer applications has a discrete solid body 104 with opposing generally parallel major surfaces 106 and 107. The solid body 104 has a sealed porous aluminum oxide body portion 108 with a pair of external surfaces 109 and 111 constituting portions of the major surfaces 106 and 107, respectively. The body portion 108 has an electrically insulated aluminum trace 112 embedded therein. The trace 112 includes a major horizontal coil-shaped trace portion 113 and two minor vertical trace portions 114 and 116 with exterior surfaces 117 and 118, respectively, constituting portions of the major surfaces 109 and 111, respectively. A typical device 103 has the following specification: 1=0.5 cm, w=0.5 cm, $h_1=150$ μm, $h_2=h_3=h_4=50$ μm, a=100 μm, c=500 μm.

Figure 23:
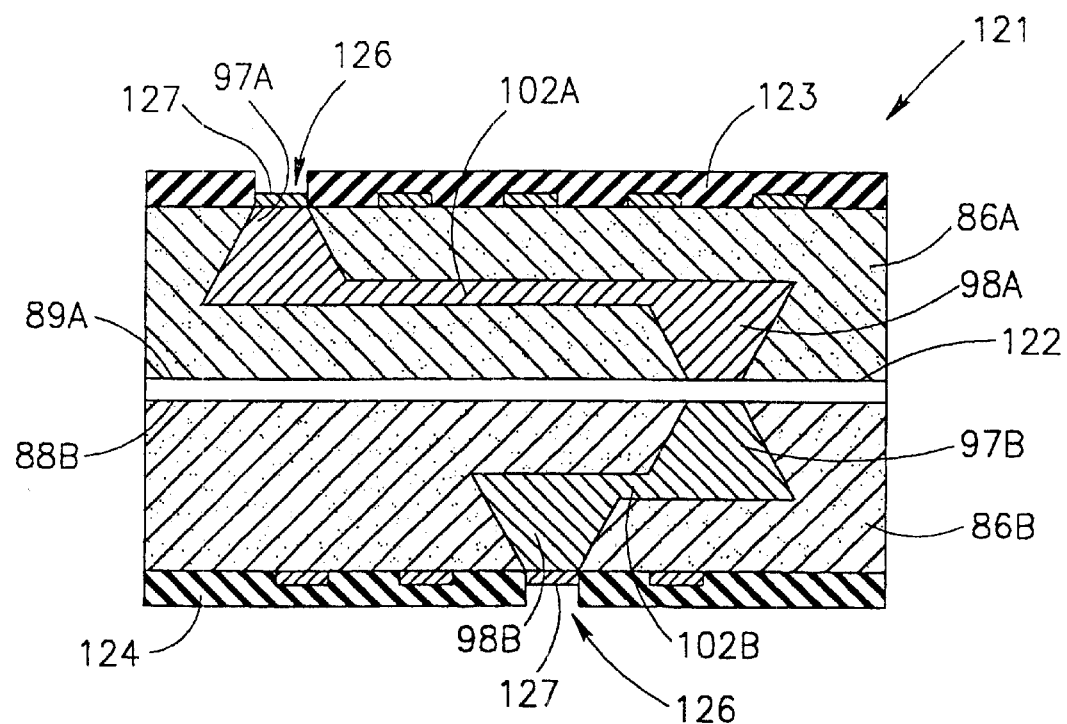
FIG. 23 is a cross sectional view of a multi-layer device including an intermediate adhesive layer.
Figure 24:
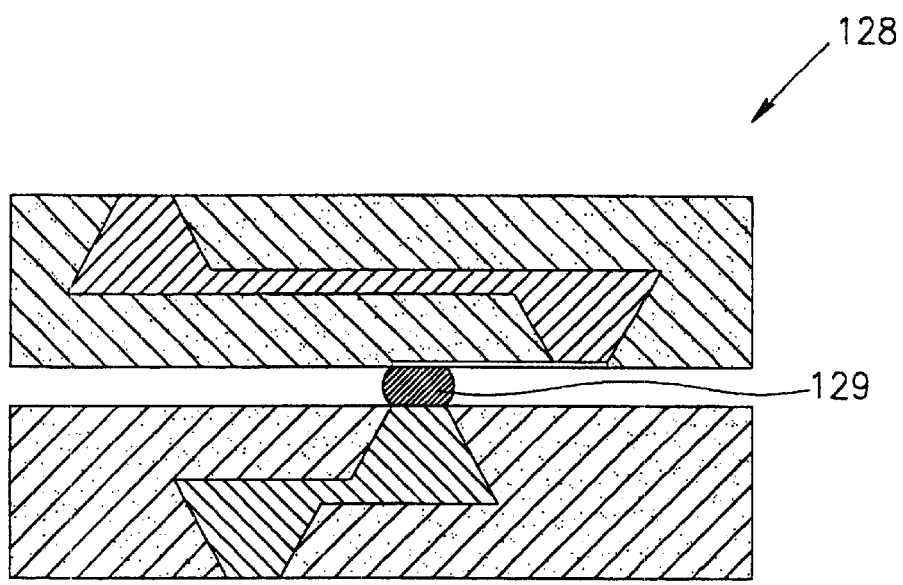
FIG. 24 is a cross sectional view of a multi-layer device including electrically conductive solder balls.

Turning now to FIG. 23, a multi-layer device 121 includes a pair of vertically stacked devices 86A and 86B, each device 86A and 86B having major surfaces 88 and 89, a trace 102, and vertical trace portions 97 and 98. An intermediate layer constituted by a z-axis anisotropic adhesive layer 122, for example, commercially available from Loctite Corp. or Sheldhal, USA. is interdisposed between the opposite surfaces 89A and 88B of the two devices 86A and 86B for both mechanically bonding the two devices and also for providing electrical connection between the opposite vertical trace portions 98A and 97B, thereby enabling a through connection between the vertical trace portion 97A and the vertical trace portion 98B. The multi-layer device 121 further includes top and bottom solder mask layers 123 and 124 with apertures 126 revealing metal contacts 127 connected to the vertical trace portions 97A and 98B. FIG. 24 shows a multi-layer device 128 similar to the multi-layer device 121 except that electrically conducting solder balls 129 are employed instead of the z-axis anisotropic adhesive layer 122.

It can be appreciated that multi-layer devices 121 and 128 can be constructed from a wide range of the aforedescribed devices, and in particular from devices 37, for enabling a wide variety of different interconnection topographies. In addition, a multi-layer device can include a vertical stack of two or more devices depending on the desired complexity.

Figure 25:
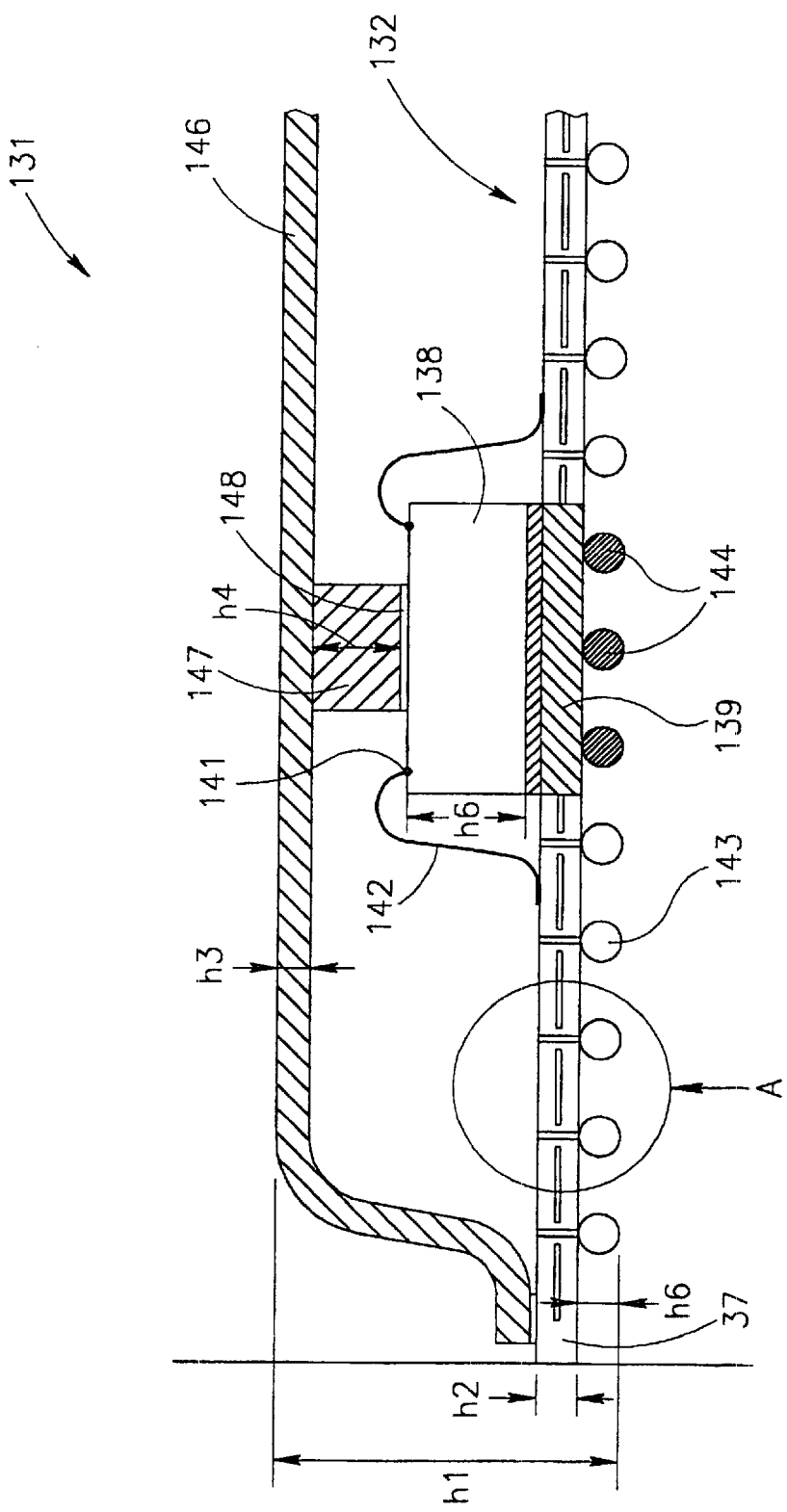
FIG. 25 is a cross sectional view of a BGA package in a cavity up, wire, bonded configuration.
Figure 26:
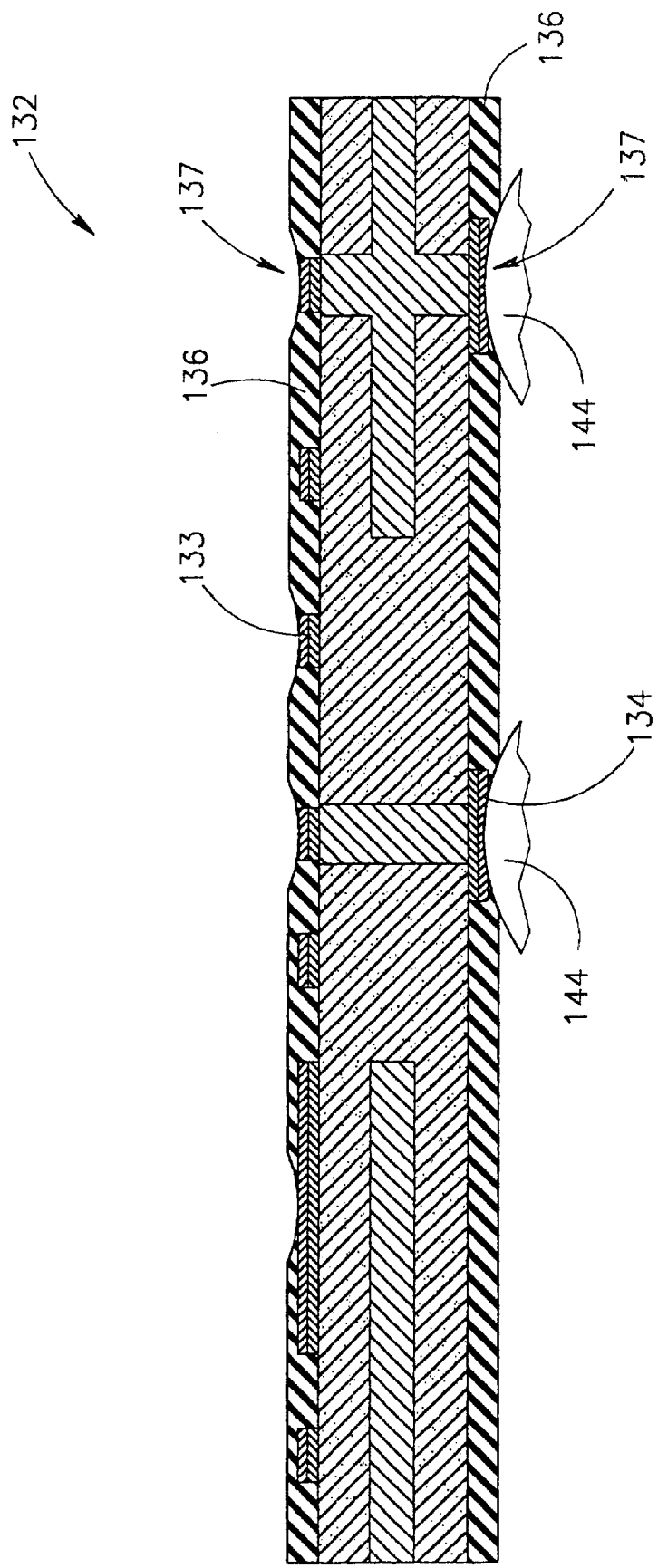
FIG. 26 is a close-up cross sectional view of the BGA interposer structure of the BGA package of FIG. 25.

Turning now to FIGS. 25 and 26, a BGA package 131 includes a BGA interposer structure 132 constituted by a device 37, an upper pad and signal layer 133, a lower pad layer 134, and upper and lower solder mask layers 136 formed with apertures 137. Upper pad and signal layer 133, and lower pad layer 134 each include 0.15 μm gold, 4 μm nickel and 15 μm copper layers. Solder mask layers 136 have a maximum thickness of 50 μm. The BGA package 131 includes one or more dies 138 (only one of which is shown) which is adhesively mounted on an aluminum slug 139 integrally formed in the BGA interposer structure 132. The aluminum slug 139 is throughgoing and has the same footprint as the die 138. The die's 110 pads 141 are connected to the upper-pad layer 133 by wire bonds 142 whilst Sn/Pb solder balls 143 are connected between the bottom pad layer 134. and a PCB board (not shown). Additional Sn/PB solder balls 144 are connected to the underside of the aluminum slug 139 for heat dissipation from the die 138. A metal cover 146 covers the BGA interposer structure 132 and its one or more dies 138. The metal cover 146 includes downward depending projections 147 for being juxtaposed against the top surfaces of the one or more dies 138 for further facilitating heat dissipation therefrom. Typically, heat conduction is by way of a thin thermal grease layer 148. The cover 146 can be made from copper, aluminum, and the like. The approximate dimensions $h_1, \ldots, h_6$ are as follows: $h_1$=2.5 mm maximum, $h_2$=200 μm, $h_3$=0.25 to 0.5 mm, $h_4$=0.5 mm, $h_5$=0.5 to 0.6 mm, $h_6$=0.6 mm, and the adhesive layer between the die and the slug is between about 0.03 and about 0.06 mm.

Figure 27:
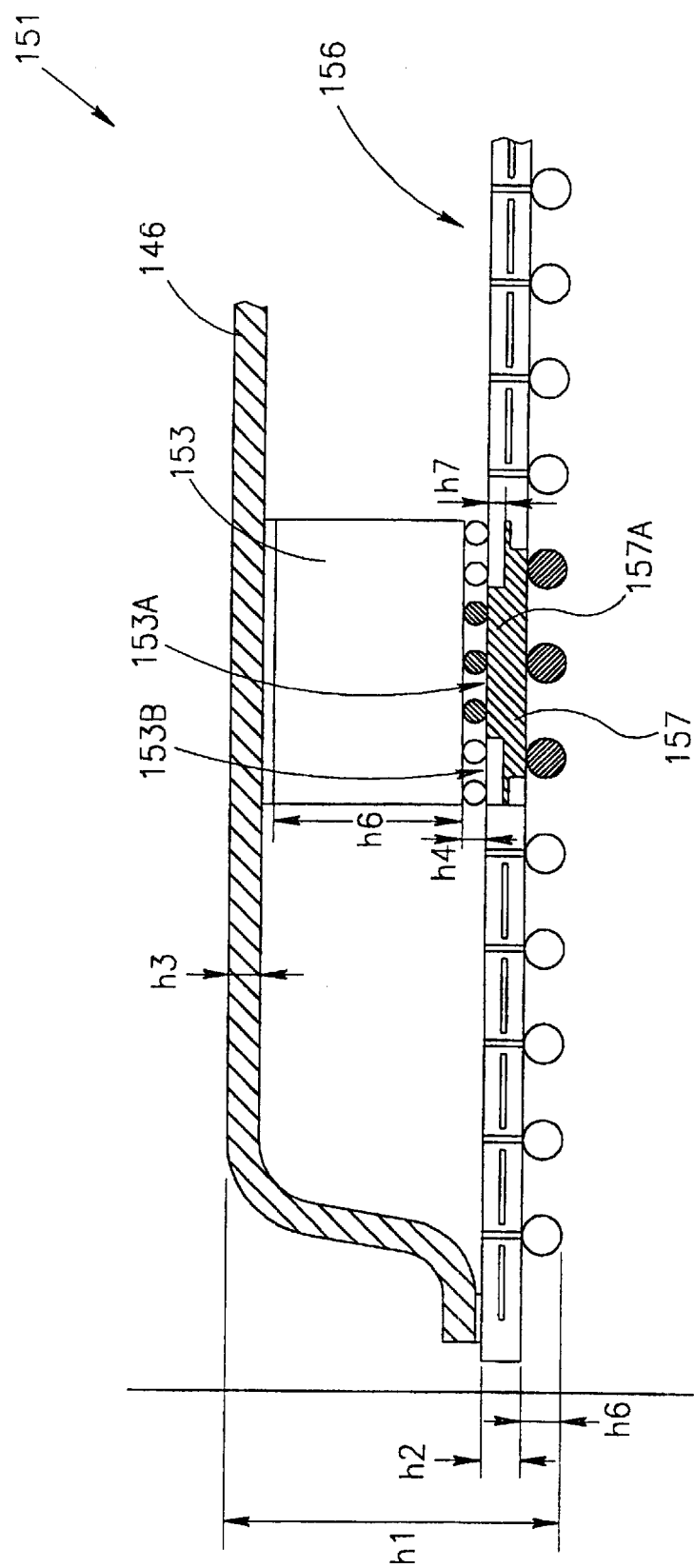
FIG. 27 is a cross sectional view of a BGA package including a flip chip die with an electrically inoperative central portion of bumps, and a peripheral portion of I/O bumps.
Figure 28:
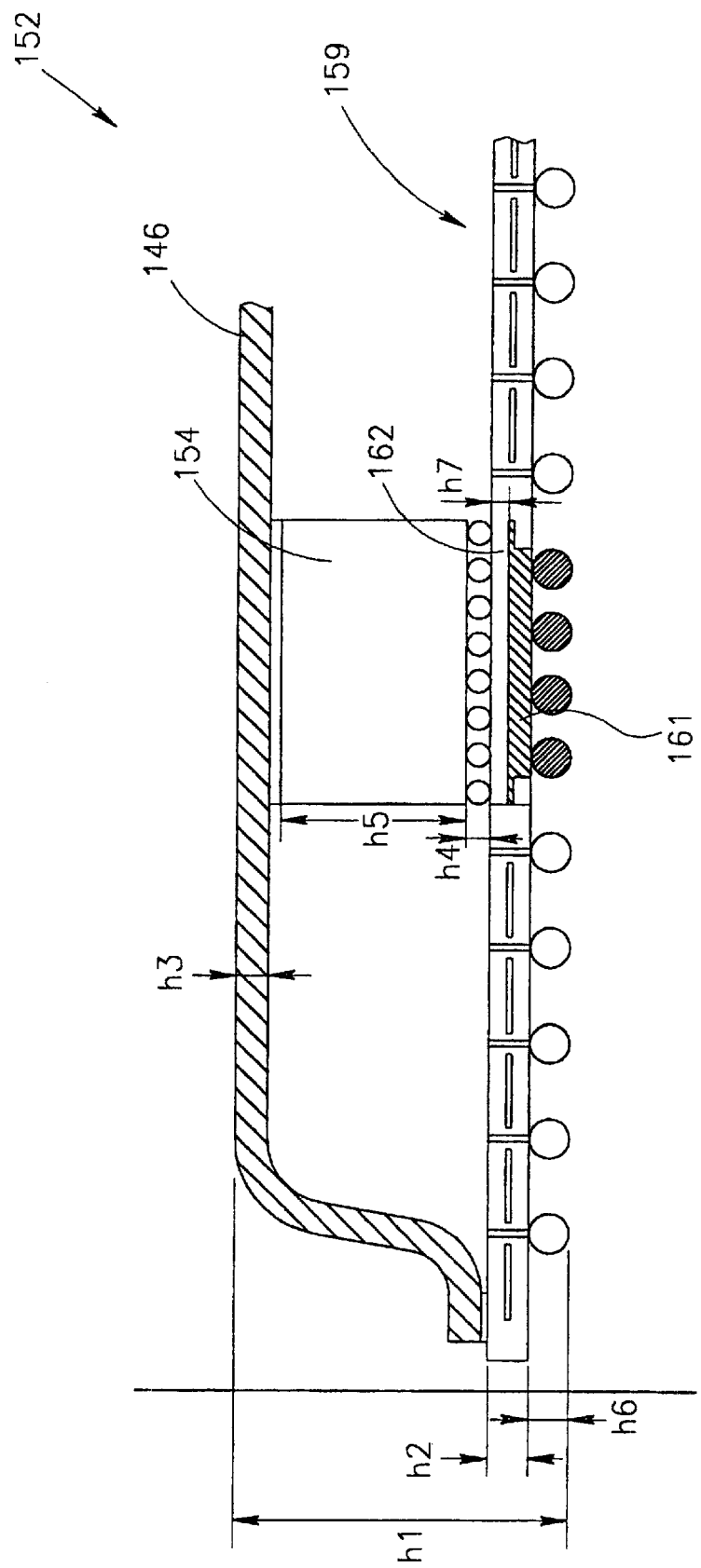
FIG. 28 is a cross sectional view of a BGA package with a full array I/O flip chip die.

Turning now to FIGS. 27 and 28, BGA packages 151 and 152 are similar to the BGA package 131 except that they are adapted for two different types of flip chip dies, namely, a flip chip die 153 having an array of bumps with an electrically inoperative central portion of bumps 153A and a peripheral portion of I/O bumps 153B, and a flip chip die 154 with a full array of I/O bumps, respectively. In the former case, the BGA package 151 includes a BGA interposer structure 156 with a slug 157 with a throughgoing central portion 157A having the same footprint as the die's central portion of bumps 153A, and an intermediate surrounding skirt 157B underlying an electrically non-conducting portion 158, thereby being in indirect thermal contact with the die's peripheral portion of I/O bumps 153B. In the latter case, the BGA structure 152 includes an interposer structure 159 with a slug 161 which is entirely covered by an electrically non-conducting portion 162, whereby the entire fill array of I/O bumps is in indirect thermal contact with the slug 161. Both BGA packages 151 and 152 include covers 146 in direct thermal contact with the top surfaces of the dies for dissipating heat therefrom. The approximate dimensions $h_1, \ldots, h_7$ of the BGA packages 151 and 152 are as follows: $h_1$=2.1 mm maximum, $h_2$=200 μm, $h_3$=0.25 to 0.5 mm, $h_4$=140±15 μm, $h_5$=0.5 to 0.6 mm, $h_6$=0.6 mm, and $h_7$=80 μm-90 μm.

Figure 29:
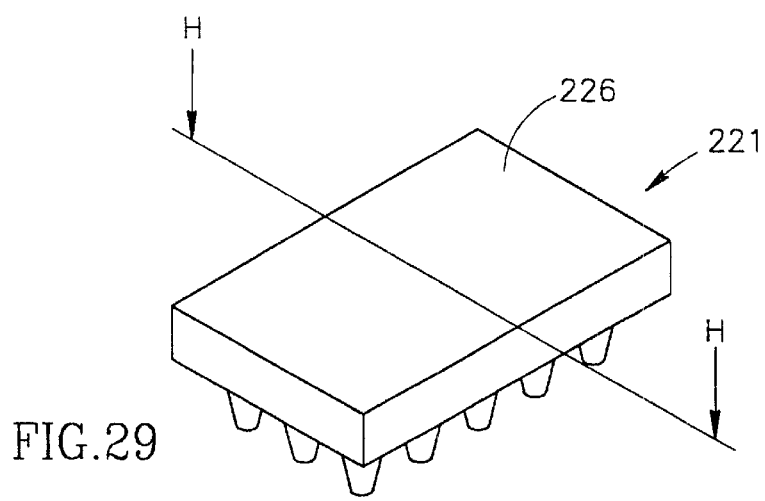
FIG. 29 is a perspective view of a first embodiment of a pin jig fixture in accordance of the present invention.
Figure 30:
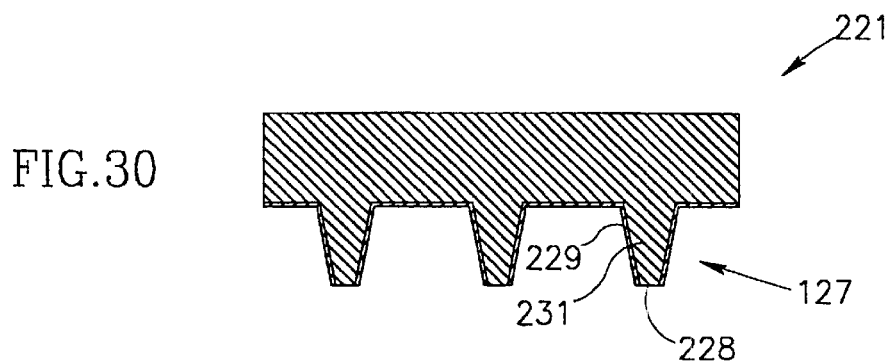
FIG. 30 is a cross section view of the pin jig fixture of FIG. 31 along line I—I in FIG. 29.
Figure 31:
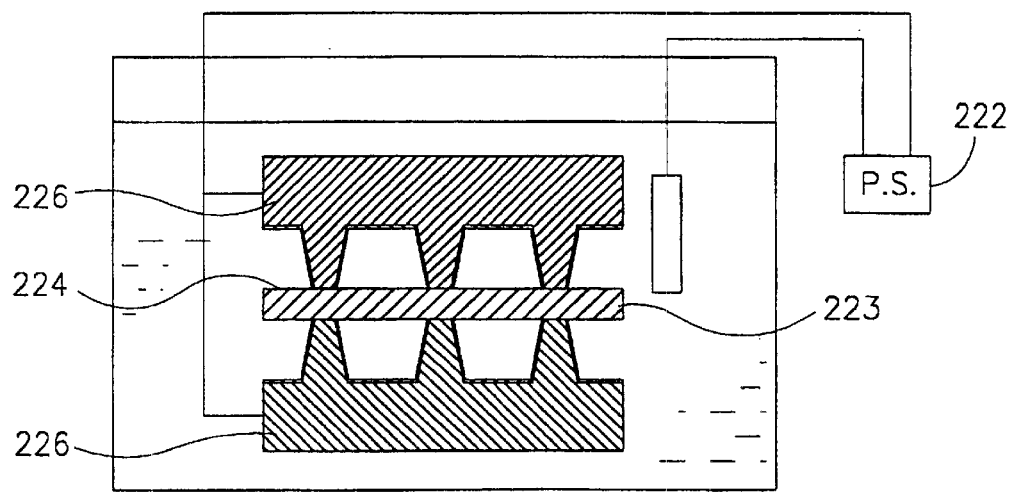
FIG. 31 is a side view showing the mechanical clamping of a valve metal blank by two pin jig fixtures of FIG. 29.

Turning now to FIGS. 29–31, a pin jig fixture 221 for use with an electrical power source (PS) 222 for porous anodization of a valve metal blank 223 with a surface 224 includes a bed of cone shaped pins 226. The bed of pins 226 is made from titanium and is directly connected to the power source 222. Each pin 227 has a leading end surface 228 for intimate juxtaposition against the surface 224 for connection of the blank 223 to the power source 222. During porous anodization, all the underside surface of the pin jig fixture 221 including the peripheral surfaces 229 of the pins 227 is converted into dense titanium oxide whilst all its interior including the cores 231 of the pins 227 remain titanium such that the pin jig fixture 221 is suitable for multiple porous anodizations. In an alternate embodiment of the pin jig fixture 221, the bed of pins 226 is made from aluminum whereupon during porous anodization, the entire bed of pins 226 is eventually converted to porous aluminum oxide.

Figure 32:
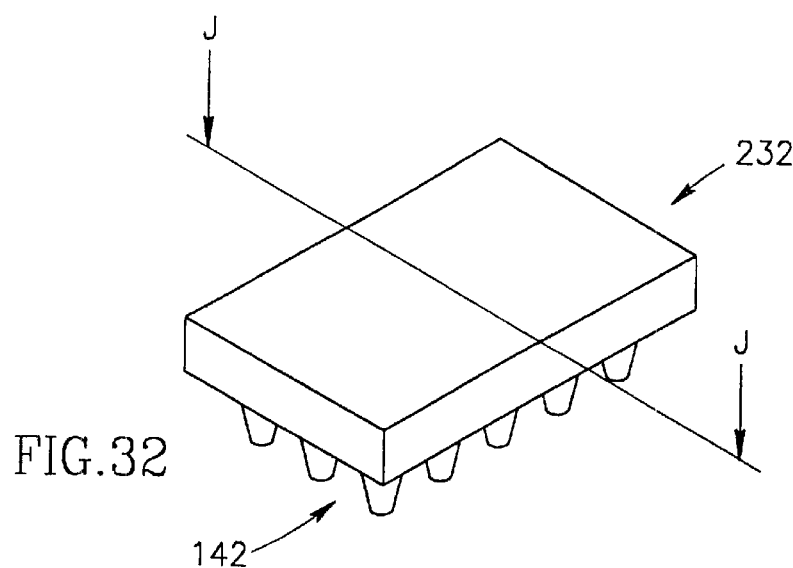
FIGS. 32–34 correspond to FIGS. 29–31 in accordance with a second embodiment of a pin jig fixture of the present invention.
Figure 33:
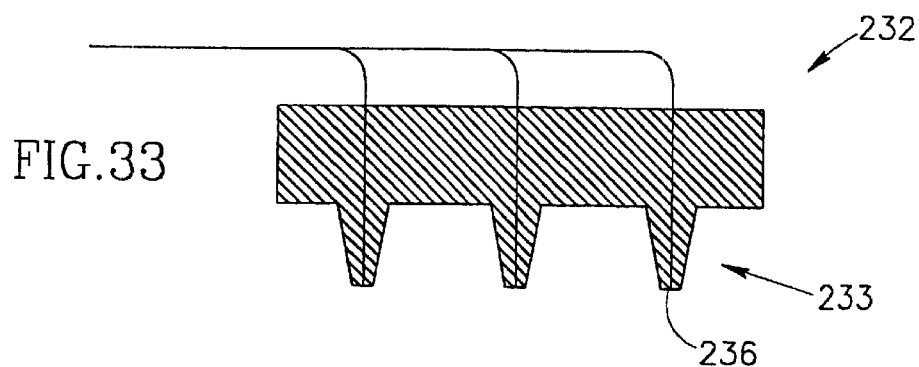
Figure 34:
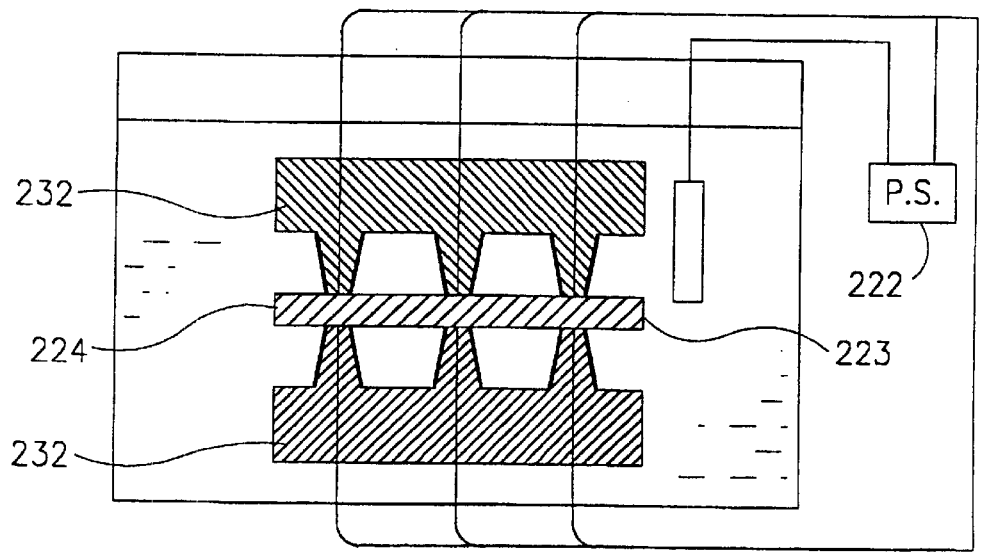

Turning now to FIGS. 32–34, a pin jig fixture 232 similar to the pin jig fixture 221 and differs therefrom in that its bed of pins 233 is made from a non-metal substance. for example, ceramics whilst each pin 234 has a metal leading end surface 236 connected to the power source 222 and for intimate juxtaposition against the surface 224 of a valve metal blank 223.

While the invention has been described with respect to a limited number of embodiments, it will be appreciated that many variations. modifications, and other applications of the invention can be made.

What is claimed is:

1. A device comprising a discrete solid body having a pair of opposing generally parallel major surfaces, said solid body having a body portion of a porous valve metal oxide based material with a pair of exteriors surfaces respectively constituting portions of said major surfaces and extending inward from one said major surface towards the other said major surface, said body portion having one or more electrically insulated valve metal conductive traces of from about 10 μm to about 400 μm thickness in a direction from one said major surface to the other said major surface embedded therein, one or more of said traces having a trace portion divergingly extending inward from an exterior surface constituting a portion of one of said major surfaces.

2. A device according to claim 1 wherein said body portion has first and second adjacent portions with respective thicknesses of porous valve metal oxide based material in a direction between said opposing major surfaces wherein said first thickness equals the thickness between said pair of opposing major surfaces and said second thickness equals zero thickness.

3. A device according to claim 1 wherein said body portion has first and second adjacent portions with respective thicknesses of porous valve metal oxide based material in a direction between said major surfaces wherein said first thickness equals the thickness between said pair of opposing major surfaces and said second thickness is less than said first thickness inwardly extending from one major surface to the other major surface.

4. A device according to claim 3 wherein said second portion has thicknesses of porous valve metal oxide base material inwardly extending from both of said pair of opposing surfaces and sum of said thicknesses is less than said first thickness.

5. A device according to claim 1 wherein said one or more electrically insulated traces is constituted by one or more electrically insulated vias extending between said opposing major surfaces.

6. A device according to claim 5 wherein said solid body has one or more recesses inwardly extending from one major surface to the other major surface thereby defining a thin portion atop each recess, one or more of said thin portions each being formed with a via.

7. A device according to claim 5 and wherein said one or more electrically conductive traces further comprises a slab with major surfaces substantially parallel to said opposing major surfaces, said slab having one or more porous valve metal oxide based material tubular portions in registration with said one or more vias such that a via passes through a tubular portion.

8. A device according to claim 7 and wherein said slab is connected to one or more of said vias.

9. A device according to claim 1 wherein said one or more electrically conductive traces is constituted by a trace having a major horizontal trace portion and two or more minor vertical trace portions connected to said major horizontal trace portion and each having an exterior surface.

10. A device according to claim 9 wherein said major trace portion is generally rod shaped.

11. A device according to claim 9 wherein said major trace portion is coil shaped.

12. A multi-layer device comprising:
(a) a vertical stack of two or more devices according claim 1 whereby a pair of said devices have opposite surfaces each with one ore more electrical contacts; and
(b) an intermediate layer is interdisposed between a pair of said opposite surfaces for enabling electrical connection between a pair of electrical contacts on opposite sides thereof.

13. The multi-layer device according to claim 12 wherein an intermediate layer includes electrically conducting solder balls.

14. The multi-layer device according to claim 12 wherein an intermediate layer includes electrically conducting solder balls.

15. A BGA package comprising:
(a) a BGA interposing structure including a device according to claim 1 with a valve metal slug, an upper pad and signal layer, and a lower pad layer with solder balls;
(b) a die having I/O connected to said upper pad and signal layer, and overlying said slug and in thermal connection therewith for dissipating heat therefrom said slug; and
(c) a cover for covering said BGA interposer structure.

16. The BGA package according to claim 15 wherein the die is a wire bond type die, and the die is adhesively mounted on said slug.

17. The BGA package according to claim 16 wherein said cover has a downward depending projection in thermal communication with the top surface of the die for heat dissipation therefrom through said cover.

18. The BGA structure according to claim 15 wherein the die is a flip chip die having an array of bumps with a central portion in direct thermal contact with sid slug, and a peripheral portion of I/O bumps in indirect thermal contact with said slug via an electrically insulating portion of said BGA interposer structure.

19. The BGA package according to claims 18 wherein said cover is in thermal communication with the top surface of the die for dissipating heat therefrom through said cover.

20. The BGA package according to claim 15 wherein the die is a flip chip die having a full array of I/O bumps in indirect thermal contact with said slug via an electrically insulating portion of said BGA interposer structure.

21. The device of claim 1 wherein the metal of said valve metal traces and the metal of said porous metal oxide are the same metal.

22. A process for manufacturing a device having a desired product specification, the process comprising the steps of:
(a) providing a discrete valve metal blank having a pair of opposing generally parallel major surfaces;
(b) selectively masking at least one of the major surfaces of the blank in accordance with the desired specification; and
(c) porously anodizing the selectively masked blank for converting a body portion thereof into porous valve metal oxide and having a pair of exterior surfaces respectively constituting portions of the major surfaces and extending inward from one major surface to the other major surface, the body portion having one or more electrically insulated valve metal conductive traces of from about 10 $\mu$m to about 400 $\mu$m thickness in a direction from one major surface to the other major surface embedded therein, one or more of the traces having a trace portion divergingly extending inward from an exterior surface constituting a portion of one of the major surfaces.

23. A process according to claim 22 wherein step (b) includes selectively masking one opposing major surface and substantially entirely masking the other opposing major surface and step (c) includes a one stage one-sided porous anodization whereby each trace portion continuously diverges from the selectively masked major surface to the entirely masked major surface.

24. A process according to claim 22 wherein (b) includes selectively masking both opposing major surface and step (c) includes a one stage dual-sided porous anodization whereby each trace portion initially diverges and thereafter converges from one selectively masked major surface towards the other selectively masked major surface.

25. A process according to claim 22 wherein an intermediate product has at least one major surface with a pattern of valve metal exterior surfaces and step (b) includes at least selectively masking a portion of the pattern of valve metal exterior surfaces and step (c) includes porously anodizing the at least one major surface with a partially masked pattern of valve metal exterior surfaces.

26. A process according to claim 25 further comprising the steps of selectively masking at least oen opposing major surface of a blank and porously anodizing the at least one selectively masked major surface to obtain the pattern of valve metal exterior surfaces of the intermediate product.

27. A process according to claim 26 wherein the step of densely anodizing forms a pattern of dense oxide masking elements, each dense oxide masking element being of a predetermined thickness is a direction form one major surface to the other major surface whereby a dense oxide masking element delays porous anodization as a function it its thickness.

28. A process according to claim 25 further comprising the steps of selectively masking at least one opposing major surface of a clank and densely anodizing the at least one selectively masked major surface to obtain the pattern of valve metal exterior surfaces fo the intermediate product.

29. The process of claim 22 wherein the valve metal of which said valve metal blank is formed, and the valve metal of said traces, are the same valve metal.

30. A pin jig fixture for use with an electrical power source for porous anodization of a valve metal blank having a surface, the pin jig fixture comprising a bed of pins each having a leading end surface for intimate juxtaposition against the surface for masking a corresponding area thereof, one or more of said leading end surfaces being directly connected to the electrical power source for electrically connecting the electrical power source to the surface on intimate juxtaposition thereagainst.

31. A pin jig fixture according to claim 30 wherein said bed of pins is formed from an electrically conductive metal based material.

32. A pin jig fixture according to claim 31 wherein said bed of nails is formed from an anodization resistant valve metal based material.

* * * * *

UNITED STATES PATENT AND TRADEMARK OFFICE
CERTIFICATE OF CORRECTION

PATENT NO. : 6,670,704 B1
DATED : December 30, 2003
INVENTOR(S) : Neftin et al.

It is certified that error appears in the above-identified patent and that said Letters Patent is hereby corrected as shown below:

<u>Title page,</u>
Item [56], References Cited, U.S. PATENT DOCUMENTS, insert the following:

```
--
        6,262,477 A    7/2001    Mahulikar et al.
        5,946,600 A    8/1999    Hurwitz et al.
        6,236,112 A    5/2001    Horiuchi et al.
        5,952,083 A    9/1999    Parthasarathi et al.
        6,046,499 A    4/2000    Yano et al.
        6,235,181 A    5/2001    Kinard et al.
        5,022,976 A    6/1991    Roll et al.
        5,661,341 A    8/1997    Neftin
        5,355,283 A   10/1994    Marrs et al.
        5,045,921 A    9/1991    Lin et al.
        5,583,778 A   12/1998    Wind
        5,767,575 A    6/1998    Lan et al.
        5,629,835 A    5/1997    Mahulikar et al.
        3,622,473 A   11/1971    Ohta et al.
        5,262,226 A   11/1993    Yoshida
        4,285,781 A    8/1981    Le Rouzic et al.
        2,305,990 A   12/1942    Prest
        6,072,233 A    6/2000    Corisis et al.
                                                          --
```

FOREIGN PATENT DOCUMENTS, insert the following:

```
--      PCT         94 22168      9/1994
        PCT         95 08841      3/1995
        PCT         98 53499     11/1998
        EP          335 291      10/1989
        FR          2 459 557     1/1981    --
```

OTHER PUBLICATIONS, insert the following:

-- Abstract, Dewent Publications, XP-002072462, JP54032279, "Multilevel wire pattern forming semicondoctor substrate select Anodise Metallic film Metallic Mask pattern", Inventor Gijutsu, March 9, 1979.

Patent Abstracts of Japan, Publication No. 03075604, Publication Date, March 29, 1991, "Residual Metal Type Polarizable Optical Wavelength Element", Inventor Uemura.

Abstract, Inventor Anonymous, XP-002072461, June 1, 1980, "High Speed Metal Carrier Packaging System Using Thin Film Interconnection Technique", IBM Technical Disclosure Bulletin, Vol. 23, no. 1, pp. 374-377.

UNITED STATES PATENT AND TRADEMARK OFFICE
CERTIFICATE OF CORRECTION

PATENT NO.   : 6,670,704 B1
DATED        : December 30, 2003
INVENTOR(S)  : Neftin et al.

It is certified that error appears in the above-identified patent and that said Letters Patent is hereby corrected as shown below:

OTHER PUBLICATIONS, cont'd.,

Abstract, Dewent Publication, FR2466103, March 27, 1981, Inventor Lerouzic, "Circuit board with aluminum tracks on alumina base-uses metallic base with alumina layer over which granular aluminium is deposited and selectively oxidized to form conductive paths".

Patent Abstracts of Japan, Publication No. JP 1180998, Publication Date, July 18,1989, Inventor Nobunaga, "Selective Anodic Oxidation Method".

Patent Abstracts of Japan Inventor Yuuji, Publication No. JP 59094438, Publication Date May 31, 1984, "Forming Method of Patterned Aluminum Layer".

Signed and Sealed this

Twenty-fifth Day of May, 2004

JON W. DUDAS
*Acting Director of the United States Patent and Trademark Office*